US007245500B2

(12) United States Patent
Khan et al.

(10) Patent No.: US 7,245,500 B2
(45) Date of Patent: Jul. 17, 2007

(54) BALL GRID ARRAY PACKAGE WITH STEPPED STIFFENER LAYER

(75) Inventors: Reza-ur Rahman Khan, Rancho Santa Margarita, CA (US); Sam Ziqun Zhao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/284,371

(22) Filed: Oct. 31, 2002

(65) Prior Publication Data

US 2003/0146503 A1   Aug. 7, 2003

Related U.S. Application Data

(60) Provisional application No. 60/352,877, filed on Feb. 1, 2002.

(51) Int. Cl.
*H05K 7/02* (2006.01)
*H05K 7/06* (2006.01)
*H05K 7/10* (2006.01)

(52) U.S. Cl. .................... 361/760; 361/720; 361/748; 361/736; 174/255; 174/262; 257/711; 257/687

(58) Field of Classification Search ................ 361/760, 361/748, 720, 736, 807, 820, 709, 719, 702, 361/740, 741; 257/777, 778, 699, 687, 711; 174/262, 255
See application file for complete search history.

(56) References Cited

U.S. PATENT DOCUMENTS 3,790,866 A    2/1974 Meyer et al.

4,611,238 A    9/1986 Lewis et al.
5,045,921 A    9/1991 Lin et al.
5,065,281 A    11/1991 Hernandez et al.

(Continued)

FOREIGN PATENT DOCUMENTS

DE    100 56 281 A 1    11/2000

(Continued)

OTHER PUBLICATIONS

Ahn, S.H. and Kwon, Y.S., "Popcorn Phenomena in a Ball Grid Array Package", IEEE Transactions on Components, Packaging, and Manufacturing Technology Part B: Advanced Packaging, IEEE, Aug. 1995, vol. 18, No. 3, pp. 491-496.

(Continued)

*Primary Examiner*—Tuan Dinh
*Assistant Examiner*—Hung S. Bui
(74) *Attorney, Agent, or Firm*—Sterne, Kessler, Goldstein & Fox P.L.L.C.

(57) ABSTRACT

Electrically, thermally and mechanically enhanced ball grid array (BGA) packages are described. An IC die is mounted on a first surface of a stiffener. A first surface of a substrate is attached to a second surface of the stiffener that is opposed to the first surface of the stiffener. A bond pad of the IC die is coupled to a contact pad on the first surface of the substrate with a wire bond. The wire bond is coupled over a recessed step region in the first surface of the stiffener and through a through-pattern in the stiffener that has an edge adjacent to the recessed step region. The through-pattern in the stiffener is one of an opening through the stiffener, a recessed portion in an edge of the stiffener, or other through-pattern.

71 Claims, 14 Drawing Sheets

U.S. PATENT DOCUMENTS

| | | |
|---|---|---|
| 5,173,766 A | 12/1992 | Long et al. |
| 5,208,504 A | 5/1993 | Parker et al. |
| 5,216,278 A | 6/1993 | Lin et al. |
| 5,285,352 A | 2/1994 | Pastore et al. |
| 5,291,062 A | 3/1994 | Higgins, III |
| 5,294,826 A | 3/1994 | Marcantonio et al. |
| 5,366,589 A | 11/1994 | Chang |
| 5,394,009 A | 2/1995 | Loo |
| 5,397,917 A | 3/1995 | Ommen et al. |
| 5,397,921 A | 3/1995 | Karnezos |
| 5,409,865 A | 4/1995 | Karnezos |
| 5,433,631 A | 7/1995 | Beaman et al. |
| 5,438,216 A | 8/1995 | Juskey et al. |
| 5,474,957 A | 12/1995 | Urushima |
| 5,490,324 A | 2/1996 | Newman |
| 5,534,467 A | 7/1996 | Rostoker |
| 5,541,450 A | 7/1996 | Jones et al. |
| 5,552,635 A | 9/1996 | Kim et al. |
| 5,572,405 A | 11/1996 | Wilson et al. |
| 5,578,869 A | 11/1996 | Hoffman et al. |
| 5,583,377 A | 12/1996 | Higgins, III |
| 5,583,378 A | 12/1996 | Marrs et al. |
| 5,642,261 A | 6/1997 | Bond et al. |
| 5,648,679 A | 7/1997 | Chillara et al. |
| 5,650,659 A | 7/1997 | Mostafazadeh et al. |
| 5,691,567 A | 11/1997 | Lo et al. |
| 5,717,252 A | 2/1998 | Nakashima et al. |
| 5,736,785 A | 4/1998 | Chiang et al. |
| 5,796,170 A | 8/1998 | Marcantonio |
| 5,798,909 A | 8/1998 | Bhatt et al. |
| 5,801,432 A | 9/1998 | Rostoker et al. |
| 5,835,355 A | 11/1998 | Dordi |
| 5,843,808 A | 12/1998 | Karnezos |
| 5,844,168 A | 12/1998 | Schueller et al. |
| 5,856,911 A | 1/1999 | Riley |
| 5,866,949 A | 2/1999 | Schueller |
| 5,883,430 A | 3/1999 | Johnson |
| 5,889,324 A | 3/1999 | Suzuki |
| 5,894,410 A | 4/1999 | Barrow |
| 5,901,041 A | 5/1999 | Davies et al. |
| 5,903,052 A | 5/1999 | Chen et al. |
| 5,905,633 A * | 5/1999 | Shim et al. .................. 361/704 |
| 5,907,903 A | 6/1999 | Ameen et al. |
| 5,920,117 A | 7/1999 | Sono et al. |
| 5,949,137 A | 9/1999 | Domadia et al. |
| 5,953,589 A * | 9/1999 | Shim et al. .................. 438/106 |
| 5,972,734 A | 10/1999 | Carichner et al. |
| 5,977,626 A | 11/1999 | Wang et al. |
| 5,986,340 A | 11/1999 | Mostafazadeh et al. |
| 5,986,885 A | 11/1999 | Wyland |
| 5,998,241 A | 12/1999 | Niwa |
| 5,999,415 A | 12/1999 | Hamzehdoost |
| 6,002,147 A | 12/1999 | Iovdalsky et al. |
| 6,002,169 A | 12/1999 | Chia et al. |
| 6,011,304 A | 1/2000 | Mertol |
| 6,011,694 A | 1/2000 | Hirakawa |
| 6,013,948 A | 1/2000 | Akram et al. |
| 6,020,637 A | 2/2000 | Karnezos |
| 6,028,358 A | 2/2000 | Suzuki |
| 6,057,601 A | 5/2000 | Lau et al. |
| 6,060,777 A | 5/2000 | Jamieson et al. |
| 6,069,407 A | 5/2000 | Hamzehdoost |
| 6,077,724 A | 6/2000 | Chen |
| 6,084,297 A | 7/2000 | Brooks et al. |
| 6,084,777 A | 7/2000 | Kalidas et al. |
| 6,114,761 A | 9/2000 | Mertol et al. |
| 6,117,797 A | 9/2000 | Hembree |
| 6,122,171 A | 9/2000 | Akram et al. |
| 6,133,064 A | 10/2000 | Nagarajan et al. |
| 6,140,707 A | 10/2000 | Plepys et al. |
| 6,160,705 A | 12/2000 | Stearns et al. |
| 6,162,659 A | 12/2000 | Wu |
| 6,163,458 A | 12/2000 | Li |
| 6,166,434 A | 12/2000 | Desai et al. |
| 6,184,580 B1 | 2/2001 | Lin |
| 6,201,300 B1 | 3/2001 | Tseng et al. |
| 6,212,070 B1 | 4/2001 | Atwood et al. |
| 6,242,279 B1 | 6/2001 | Ho et al. |
| 6,246,111 B1 | 6/2001 | Huang et al. |
| 6,288,444 B1 | 9/2001 | Abe et al. |
| 6,313,521 B1 | 11/2001 | Baba |
| 6,313,525 B1 * | 11/2001 | Sasano .................. 257/704 |
| 6,347,037 B2 | 2/2002 | Iijima et al. |
| 6,362,525 B1 | 3/2002 | Rahim |
| 6,369,455 B1 | 4/2002 | Ho et al. |
| 6,380,623 B1 | 4/2002 | Demore |
| 6,455,348 B1 * | 9/2002 | Yamaguchi ................. 438/106 |
| 6,462,274 B1 | 10/2002 | Shim et al. |
| 6,472,741 B1 | 10/2002 | Chen et al. |
| 6,525,942 B2 | 2/2003 | Huang et al. |
| 6,528,869 B1 * | 3/2003 | Glenn et al. ................. 257/678 |
| 6,528,892 B2 | 3/2003 | Caletka et al. |
| 6,541,832 B2 | 4/2003 | Coyle |
| 6,545,351 B1 | 4/2003 | Jamieson et al. |
| 6,552,266 B2 | 4/2003 | Carden et al. |
| 6,552,428 B1 | 4/2003 | Huang et al. |
| 6,552,430 B1 | 4/2003 | Perez et al. |
| 6,563,712 B2 | 5/2003 | Akram et al. |
| 6,583,516 B2 | 6/2003 | Hashimoto |
| 2001/0045644 A1 | 11/2001 | Huang |
| 2002/0053731 A1 | 5/2002 | Chao et al. |
| 2002/0072214 A1 | 6/2002 | Yuzawa et al. |
| 2002/0079562 A1 | 6/2002 | Zhao et al. |
| 2002/0079572 A1 | 6/2002 | Khan et al. |
| 2002/0096767 A1 | 7/2002 | Cote et al. |
| 2002/0098617 A1 | 7/2002 | Lee et al. |
| 2002/0109226 A1 | 8/2002 | Khan et al. |
| 2002/0135065 A1 | 9/2002 | Zhao et al. |
| 2002/0171144 A1 | 11/2002 | Zhang et al. |
| 2002/0180040 A1 | 12/2002 | Camenforte et al. |
| 2003/0111726 A1 | 6/2003 | Khan et al. |
| 2003/0138613 A1 | 7/2003 | Thoman et al. |

FOREIGN PATENT DOCUMENTS

| | | |
|---|---|---|
| EP | 0 427 265 A2 | 5/1991 |
| EP | 0 741 507 A1 | 11/1996 |
| EP | 0 504 411 B1 | 6/1998 |
| JP | 61-49446 | 3/1986 |
| JP | 7-283336 | 10/1995 |
| JP | 10-50877 | 2/1998 |
| JP | 10-189835 | 7/1998 |
| JP | 10-247702 | 9/1998 |
| JP | 10-247703 | 9/1998 |
| JP | 11-17064 | 1/1999 |
| JP | 11-102989 | 4/1999 |
| JP | 2000-286294 | 10/2000 |
| JP | 2001-68512 | 3/2001 |
| TW | 383908 | 3/2000 |
| TW | 417219 | 1/2001 |

OTHER PUBLICATIONS

Amkor Electronics, "Amkor BGA Packaging: Taking The World By Storm", Electronic Packaging & Production, Cahners Publishing Company, May 1994, page unknown.

Anderson, L. and Trabucco, B., "Solder Attachment Analysis of Plastic BGA Modules", Surface Mount International Conference, Surface Mount International, Aug. 28-Sep. 1, 1994, San Jose, California, pp. 189-194.

Andrews, M., "Trends in Ball Grid Array Technology," Ball Grid Array National Symposium, Mar. 29-30, 1995, Dallas, Texas, 10 pages.

Attarwala, A.I. Dr. and Stierman, R., "Failure Mode Analysis of a 540 Pin Plastic Ball Grid Array", Surface Mount International Conference, Surface Mount International, Aug. 28-Sep. 1, 1994, San Jose, California, pp. 252-257.

Banerji, K., Development of the Slightly Larger Than IC Carrier (SLICC), Journal of Surface Mount Technology, Jul. 1994, pp. 21-26.

Bauer, C., Ph.D., "Partitioning and Die Selection Strategies for Cost Effective MCM Designs", Journal of Surface Mount Technology, Oct. 1994, pp. 4-9.

Bernier, W.E. et al., "BGA vs. QFP: A Summary of Tradeoffs for Selection of High I/O Components", Surface Mount International Conference Proceedings, Surface Mount International, Aug. 28-Sep. 1, 1994, San Jose, California, pp. 181-185.

Burgos, J. et al., "Achieving Accurate Thermal Characterization Using a CFD Code—A Case Study of Plastic Packages", IEEE Transactions on Components, Packaging, and Manufacturing Technology Part A, IEEE, Dec. 1995, vol. 18, No. 4, pp. 732-738.

Chadima, M., "Interconnecting Structure Manufacturing Technology," Ball Grid Array National Symposium, Dallas, Texas, Mar. 29-30, 1995.

Chanchani, R. et al., "Mini BGA: Pad and Pitch Ease Die Test and Handling", Advanced Packaging, IHS Publishing Group, May/Jun. 1995, pp. 34, 36-37.

Chung, T.C. et al., "Rework of Plastic, Ceramic, and Tape Ball Grid Array Assemblies", Ball Grid Array National Symposium Proceedings, Dallas, Texas, Mar. 29-30, 1995, pp. 1-15.

Cole, M.S. and Caulfield, T. "A Review of Available Ball Grid Array (BGA) Packages", Journal of Surface Mount Technology, Surface Mount Technology Association, Jan. 1996, vol. 9, pp. 4-11.

Cole, M.S. and Caulfield, T., "Ball Grid Array Packaging", Surface Mount International Conference Proceedings, Surface Mount International, Aug. 28-Sep. 1, 1994, San Jose, California, pp. 147-153.

Dobers, M. and Seyffert, M., "Low Cost MCMs: BGAs Provide a Fine-Pitch Alternative", Advanced Packaging, IHS Publishing Group, Sep./Oct. 1994, vol. 3, No. 5, pp. 28, 30 and 32.

Dody, G. and Burnette, T., "BGA Assembly Process and Rework", Journal of Surface Mount Technology, Surface Mount Technology Association, Jan. 1996, vol. 9, pp. 39-45.

Edwards, D. et al., "The Effect of Internal Package Delaminations on the Thermal Performance of PQFP, Thermally Enhanced PQFP, LOC and BGA Packages", 45th Electronic Components & Technology Conference, IEEE, May 21-24, 1995, Las Vegas, NV, pp. 285-292.

Ejim, T.L. et al., "Designed Experiment to Determine Attachment Reliability Drivers for PBGA Packages", Journal of Surface Mount Technology, Surface Mount Technology Association, Jan. 1996, vol. 9, pp. 30-38.

Ewanich, J. et al., "Development of a Tab (TCP) Ball Grid Array Package", Proceedings of the 1995 International Electronics Packaging Conference, San Diego, CA, Sep. 24-27, 1995, pp. 588-594.

Fauser, S. et al, "High Pin-Count PBGA Assembly", Circuits Assembly, Feb. 1995, vol. 6, No. 2, pp. 36-38 and 40.

Fauser, Suzanne et al., "High Pin Count PBGA Assembly: Solder Defect Failure Modes and Root Cause Analysis", Surface Mount International, Proceedings of The Technical Program, Surface Mount International, Aug. 28-Sep. 1, 1994, San Jose, California, pp. 169-174.

Ferguson, M. "Ensuring High-Yield BGA Assembly", Circuits Assembly, Feb. 1995, vol. 6, No. 2, pp. 54, 56 and 58.

Freda, M., "Laminate Technology for IC Packaging", Electronic Packaging & Production, Cahners Publishing Company, Oct. 1995, vol. 35, No. 11, pp. S4-S5.

Freedman, M., "Package Size and Pin-Out Standardization", Ball Grid Array National Symposium, Mar. 29-30, 1995, 7 pages.

Freyman, B. and Pennisi, R., "Over-molded Plastic Pad Arrary Carriers (OMPAC): A Low Cost High Interconnect Density IC Packaging Solution for Consumer and Industrial Electronics", 41st Electronic Components & Technology Conference, IEEE, May 11-16, 1991, pp. 176-182.

Freyman, B. et al., "Surface Mount Process Technology for Ball Grid Array Packaging", Surface Mount International Conference Proceedings, Surface Mount International, Aug. 29-Sep. 2, 1993, San Jose, California, pp. 81-85.

Freyman, B. et al., "The Move to Perimeter Plastic BGAs", Surface Mount International Conference Proceedings, San Jose, CA, Aug. 29-31, 1995, pp. 373-382.

Freyman, B., "Trends in Plastic BGA Packaging," Ball Grid Array National Symposium, Dallas, Texas, Mar. 29-30, 1995, 45 pages.

Gilleo, K., "Electronic Polymers: Die Attach and Oriented Z-Axis Films", Advanced Packaging, IHS Publishing Group, Sep./Oct. 1994, vol. 3, No. 5, pp. 37-38, 40 and 42.

Guenin, B. et al., "Analysis of a Thermally Enhanaced Ball Grid Array Package", IEEE Transactions on Componets, Packaging, and Manufacturing Technology, Part A, IEEE Components, Packaging, and Manufacturing Technology Society, Dec. 1995, vol. 18, No. 4, pp. 749-757.

Hart, C., "Vias in Pads for Coarse and Fine Pitch Ball Grid Array", Surface Mount International Conference Proceedings, Surface Mount International, Aug. 28-Sep. 1, 1994, San Jose, California, pp. 203-207.

Hart, C, "Vias in Pads", Circuits Assembly, Feb. 1995, vol. 6, No. 2, pp. 42, 44-46 and 50.

Hattas, D., "BGAs Face Production Testing: New Package Offers Promise but Must Clear Technology Hurdles.", Advanced Packaging, IHS Publishing Group, Summer 1993, vol. 2, No. 3, pp. 44-46.

Schueller, R.D. et al., "Performance and Reliability of a Cavity Down Tape BGA Package," *IEEE Electronic Packaging Technology Conference*, 1997, pp. 151-162.

Hodson, T., "Study Examines BGA Use", Electronic Packaging & Production, Mar. 1993, page unknown.

Holden, H., "The Many Techniques of Small Via Formation for Thin Boards", The Institute for Interconnecting and Packaging Electronic Circuits Ball Grid Array National Symposium, San Diego, CA, Jan. 18-19, 1996, pp. 1-7.

Houghten, J., "New Package Takes On QFPs", Advanced Packaging, IHS Publishing Group, Winter 1993, vol. 2, No. 1, pp. 38-39.

"How To Give Your BGAs A Better Bottom Line.", Advanced Packaging, IHS Publishing Group, Jan./Feb. 1995, page unknown.

Huang, W. and Ricks, J., "Electrical Characterization of PBGA for Communication Applications by Simulation and Measurement", National Electronic Packaging and Production Conference West '95, Feb. 26-Mar. 2, 1995, Anaheim, California, pp. 300-307.

Hundt, M. et al., "Thermal Enhancements of Ball Grid Arrays", National Electronic Packaging and Production Conference West '95, Reed Exhibition Companies, Anaheim, CA, Feb. 25-29, 1996, pp. 702-711.

Hutchins, C.L., "Understanding Grid Array Packages", Surface Mount Technology Magazine, IHS Publishing Group, Nov. 1994, vol. 8, No. 11, pp. 12-13.

Hwang, J.S., "Reliability of BGA Solder Interconnections", Surface Mount Technology Magazine, IHS Publishing Group, Sep. 1994, vol. 8, No. 9, pp. 14-15.

Hwang, J.S., "A Hybrid of QFP and BGA Architectures", Surface Mount Technology Magazine, IHS Publishing Group, Feb. 1995, vol. 9, No. 2, p. 18.

Johnson, R. et al., "A Feasibility Study of of Ball Grid Array Packaging", National Electronic Packaging and Production Conference East '93, Boston, Massachusetts, Jun. 14-17, 1993, pp. 413-422.

Johnson, R. et al., "Thermal Characterization of 140 and 225 Pin Ball Grid Array Packages", National Electronic Packaging & Production Conference East '93, Boston, Massachusetts, Jun. 14-17, 1993, pp. 423-430.

Johnston, P., "Land Pattern Interconnectivity Schemes", Ball Grid Array National Symposium, Dallas, Texas, Mar. 29-30, 1995, pp. 2-21.

Johnston, P. "Printed Circuit Board Design Guidelines for Ball Grid Array Packages", Journal of Surface Mount Technology, Surface Mount Technology Association, Jan. 1996, vol. 9, pp. 12-18.

Kawahara, T. et al., "Ball Grid Array Type Package by Using of New Encapsulation Method", Proceedings of the 1995 International Electronics Packaging Conference, San Diego, CA, Sep. 24-27, 1995, pp. 577-587.

Knickerbocker, J.U. and Cole, M.S., "Ceramic BGA: A Packaging Alternative", Advanced Packaging, IHS Publishing Group, Jan./Feb. 1995, vol. 4, No. 1, pp. 20, 22 and 25.

Kromann, G., et al., "A Hi-Density C4/CBGA Interconnect Technology for a CMOS Microprocessor", National Electronic Packaging and Production Conference West '95, IEEE, Feb. 26-Mar. 2, 1995, Anaheim, California, pp. 1523-1529.

Kunkle, R., "Discrete Wiring for Array Packages", Ball Grid Array National Symposium, Dallas, Texas, Mar. 29-30, 1995, 9 pages.

Lall, B. et al, "Methodology for Thermal Evaluation of Multichip Modules", IEEE Transactions on Components, Packaging, and Manufacturing Technology Part A, IEEE, Dec. 1995, vol. 18, No. 4, pp. 758-764.

Lasance, C. et al., "Thermal Characterization of Electronic Devices with Boundary Condition Independent Compact Models", IEEE Transactions on Components, Packaging, and Manufacturing Technology Part A, IEEE Components, Packaging, and Manufacturing Technology Society, Dec. 1995, vol. 18, No. 4, pp. 723-731.

Lau, J., "Ball Grid Array Technology", McGraw-Hill Inc., 1995, entire book submitted.

Lau, J. et al., "No Clean Mass Reflow of Large Plastic Ball Grid Array Packages", Circuit World, Wela Publications Ltd., vol. 20, No. 3, Mar. 1994, pp. 15-22.

"Literature Review", Special Supplement to Electronic Packaging & Production, Feb. 1995, Cahners Publication, 10 pages.

LSI Logic Package Selector Guide, Second Edition, LSI Logic Corporation, 1994-1995, entire document submitted.

"LTCC MCMs Lead to Ceramic BGAs," Advanced Packaging, IHS Publishing Group, Sep./Oct. 1994, vol. 3, No. 5, pp. 14-15.

Mak, Dr. W.C. et al., "Increased SOIC Power Dissipation Capability Through Board Design and Finite Element Modeling", Journal of Surface Mount Technology, Surface Mount International, Oct. 1994, pp. 33-41.

Marrs, R.C. and Olachea, G., "BGAs For MCMs: Changing Markets and Product Functionality", Advanced Packaging, IHS Publishing Group, Sep./Oct. 1994, vol. 3, No. 5, pp. 48, 50, and 52.

Matthew, L.C. et al., "Area Array Packaging: KGD in a Chip-Sized Package", Advanced Packaging, IHS Publishing Group, Jul./Aug. 1994, pp. 91-94.

Mawer, A. et al., "Plastic BGA Solder Joint Reliability Considerations", Surface Mount International Conference Proceedings, Surface Mount International, Aug. 28-Sep. 1, 1994, San Jose, California, pp. 239-251.

Mazzullo, T. and Schaertl, L., "How IC Packages Affect PCB Design", Surface Mount Technology Magazine, Feb. 1995, vol. 9, No. 2, pp. 114-116.

Mearig, J., "An Overview of Manufacturing BGA Technology", National Electronic Packaging and Production Conference West '95, Feb. 26-Mar. 2, 1995, Anaheim, California, pp. 295-299.

Mertol, A., "Application of the Taguchi Method on the Robust Design of Molded 225 Plastic Ball Grid Array Packages", IEEE Transactions on Components, Packaging, and Manufacturing Technology Part B: Advanced Packaging, IEEE, Nov. 1995, vol. 18, No. 4, pp. 734-743.

Mescher, P. and Phelan, G., "A Practical Comparison of Surface Mount Assembly for Ball Grid Array Components", Surface Mount International Conference Proceedings, Surface Mount International, Aug. 28-Sep. 1, 1994, San Jose, California, pp. 164-168.

Mulgaonker, S. et al., "An Assessment of the Thermal Performance of the PBGA Family", Eleventh Annual IEEE Semiconductor Thermal Measurement and Management Symposium, IEEE, San Jose, CA, Feb. 7-9, 1995,pp. 17-27.

"New PBGA Pushes Technology to Outer Limits", Advanced Packaging, IHS Publishing Group, Jan./Feb. 1995, p. 11.

Olachea, G., "Managing Heat: A Focus on Power IC Packaging", Electronic Packaging & Production (Special Supplement), Cahners Publishing Company, Nov. 1994, pp. 26-28.

"Pad Array Improves Density", Electronic Packaging & Production, Cahners Publishing Company, May 1992, pp. 25-26.

Partridge, J. and Viswanadham, P., "Organic Carrier Requirements for Flip Chip Assemblies", Journal of Surface Mount Technology, Surface Mount Technology Association, Jul. 1994, pp. 15-20.

Ramirez, C. and Fauser, S., "Fatigue Life Comparison of The Perimeter and Full Plastic Ball Grid Array", Surface Mount International Conference Proceedings, Surface Mount International, Aug. 28-Sep. 1, 1994, San Jose, California, pp. 258-266.

Rogren, P., "MCM-l Built on Ball Grid Array Formats", National Electronic Packaging and Production Conference West '94, Anaheim, California, pp. 1277-1282.

Rooks, S., "X-Ray Inspection of Flip Chip Attach Using Digital Tomosynthesis", Surface Mount International, Proceedings of The Technical Program, Aug. 28-Sep. 1, 1994, San Jose, California, pp. 195-202.

Rukavina, J., "Attachment Methodologies: Ball Grid Array Technology", Ball Grid Array National Symposium, Dallas, Texas, Mar. 29-30, 1995, 37 pages.

Sack, T., "Inspection Technology", Ball Grid Array National Symposium, Dallas, Texas, Mar. 29-30, 1995, pp. 1-41.

Sakaguchi, H., "BGA MountingTechnology," pp. 1-4, date and source unknown.

Schmolze, C. and Fraser, A., "SPICE Modeling Helps Enhance BGA Performance", Electronic Packaging & Production, Jan. 1995, pp. 50-52.

Semiconductor Group Package Outlines Reference Guide, Texas Instruments, 1995, entire document submitted.

Shimizu, J., "Plastic Ball Grid Array Coplanrity", Surface Mount International Conference, San Jose, California, Aug. 31-Sep. 2, 1993, pp. 86-91.

Sigliano, R., "Using BGA Packages: An Appealing Technology in a QFP and Fine-Pitch Market", Advanced Packaging, IHS Publishing Group, Mar./Apr. 1994, pp. 36-39.

Sirois, L., "Dispensing for BGA: Automated Liquid Dispensing in a High-Density Environment", Advanced Packaging, IHS Publishing Group, May/Jun. 1995, pp. 38 and 41.

Solberg, V., "Interconnection Structure Preparation: Impact of Material Handling and PCB Surface Finish on SMT Assembly Process Yield", Ball Grid Array National Symposium, Dallas Texas, Mar. 29-30, 1995, 10 pages.

"Survival of the Fittest", Advanced Packaging, IHS Publishing Group, Mar./Apr. 1995, page unknown.

Tuck, J., "BGA Technology Branches Out", Circuits Assembly, Feb. 1995, vol. 6, No. 2, pp. 24, 26, and 28.

"Tutorial and Short Courses", 45th Electronic Components & Technology Conference, May 21-24, 1995, Las Vegas, Nevada, IEEE, 6 pages.

Vardaman, E. J. and Crowley, R.T., "Worldwide Trends In Ball Grid Array Developments", National Electronic Packaging and Production Conference West '96, Reed Exhibition Companies, Anaheim, CA, Feb. 25-29, 1996, pp. 699-701.

Walshak, D. and Hashemi, H., "Thermal Modeling of a Multichip BGA Package", National Electronic Packaging and Production Conference West'94, Reed Exbition Companies, Anaheim, California, Feb. 27-Mar. 4, 1994, pp. 1266-1276.

Walshak, D. and Hashemi, H., "BGA Technology: Current and Future Direction for Plastic Ceramic and Tape BGAs", Surface Mount International Conference Proceedings, Surface Mount International, Aug. 28-Sep. 1, 1994, San Jose, California, pp. 157-163.

Xie, H. et al., "Thermal Solutions to Pentium Processors in TCP in Notebooks and Sub-Notebooks", 45th Electronic Components & Technology Conference, IEEE, Las Vegas, NV, May 21-24, 1995, pp. 201-210.

Yip, W.Y., "Package Characterization of a 313 Pin BGA", National Electronic Packaging and Production Conference West '95, Reed Exhibition Companies, Feb. 26-Mar. 2, 1995, Anaheim, California, pp. 1530-1541.

Zamborsky, E., "BGAs in the Assembly Process", Circuits Assembly, Feb. 1995, vol. 6, No. 2, pp. 60, 62-64.

Zimerman, M., "High Performance BGA Molded Packages for MCM Application", Surface Mount International Conference Proceedings, Surface Mount International, Aug. 28-Sep. 1, 1994, San Jose, California, pp. 175-180.

Zweig, G., "BGAs: Inspect the Process, Not the Product", Electronic Packaging & Production (Special Supplement), Cahners Publishing Company, Aug. 1994 (Supplement), pp. 41.

Houghten, J.L., "Plastic Ball-Grid Arrays Continue To Evolve", Electronic Design, Feb. 6, 1995, pp. 141-146.

Marrs, R. et al., "Recent Technology Breakthroughs Achieved with the New *Super*BGA® Package", 1995 International Electronics Packaging Conference, San Diego, California, Sep. 24-27, 1995, pp. 565-576.

Hayden, T.F. et al., "Thermal & Electrical Performance and Reliability Results for Cavity-Up Enhanced BGAs", Electronic Components and Technology Conference, IEEE,1999, pp. 638-644.

Thompson, T., "Reliability Assessment of a Thin (Flex) BGA Using a Polyimide Tape Substrate", International Electronics Manufacturing Technology Symposium, IEEE, 1999, pp. 207-213.

English-language Abstract of JP 10-189835, published Jul. 21, 1998, 2 pages (last visited Mar. 14, 2003).

English-language Abstract of JP 10-247703, published Sep. 14, 1998, 1 page.

English-language Abstract of JP 2000-286294, published Oct. 13, 2000, 2 pages (last visited Mar. 14, 2003).

English-language Abstract of JP 2001-68512, published Mar. 16, 2001, 1 page (last visited Oct. 2, 2002).

English-language Abstract of JP 10-247702, published Sep. 14, 1998, 2 pages (last visited Jan. 25, 2002).

English-language Abstract of JP 10-50877, published Feb. 20, 1998, 1 page (last visited Oct. 2, 2002).

English-language Abstract of JP 11-17064, published Jan. 22, 1999, 1 page.

English-language Abstract of JP 11-102989, published Apr. 13, 1999, 1 page.

English-language Abstract of JP 7-283336, published Oct. 27, 1995, 1 page.

English-language Abstract of JP 61-49446, published Mar. 11, 1986, 1 page.

Karnezos, M., "An EPBGA Alternative," *Advanced Packaging*, Jun. 1998, pp. 90, 92, 94, and 96.

Zhao, Z., Ph.D., "Thermal Design and Modeling of Packages," *IEEE Short Courses*, Broadcom Corporation, Oct. 25, 2000, 95 pages.

Zhao, Z., Ph.D., "IC Package Thermal Issues and Thermal Design," ASAT, Inc., Jan. 15, 2000, 98 pages, presented at 2nd International Icepak User's Group Meeting, Palo Alto, CA, on Feb. 7, 2000.

Heitmann, R., "A Direct Attach Evolution: TAB, COB and Flip Chip Assembly Challenges", Advanced Packaging, IHS Publishing Group, Jul./Aug. 1994, vol. 3, No. 4, pp. 95-99 and 103.

European Search Report for Appl. No. 03001958.2—2203; dated Mar. 6, 2006; 3 pages.

English abstract of German Patent Publication No. DE 10056281 A1, May 23, 2002, 2 pages, Derwent database.

U.S. Appl. No. 10/284,312, filed Oct. 31, 2002, Zhao et al.
U.S. Appl. No. 10/284,340, filed Oct. 31, 2002, Zhao et al.
U.S. Appl. No. 10/201,891, filed Jul. 25, 2002, Zhao et al.
U.S. Appl. No. 10/200,336, filed Jul. 23, 2002, Khan et al.
U.S. Appl. No. 10/197,438, filed Jul. 18, 2002, Zhao et al.
U.S. Appl. No. 10/201,309, filed Jul. 24, 2002, Khan et al.
U.S. Appl. No. 10/201,893, filed Jul. 25, 2002, Zhao et al.
U.S. Appl. No. 10/200,255, filed Jul. 23, 2002, Zhao et al.
U.S. Appl. No. 10/101,751, filed Mar. 21, 2002, Zhao et al.
U.S. Appl. No. 10/253,600, filed Sep. 25, 2002, Zhong et al.
U.S. Appl. No. 10/284,349, filed Oct. 31, 2002, Khan et al.
U.S. Appl. No. 10/284,166, filed Oct. 31, 2002, Zhao et al.
U.S. Appl. No. 10/284,386, filed Oct. 31, 2002, Zhao et al.

* cited by examiner stiffener temperature distribution

BALL GRID ARRAY PACKAGE WITH STEPPED STIFFENER LAYER

CROSS-REFERENCE TO RELATED APPLICATIONS

This application claims the benefit of U.S. Provisional Application No. 60/352,877, filed Feb. 1, 2002, which is herein incorporated by reference in its entirety.

The following applications of common assignee are related to the present application, have the same filing date as the present application, and are herein incorporated by reference in their entireties:

"Ball Grid Array Package Enhanced With a Thermal And Electrical Connector," Ser. No. 10/284,312. filed on Oct. 31, 2002;

"Ball Grid Array Package with Patterned Stiffener Layer," Ser. No. 10/284,340, filed on Oct. 31, 2002;

"Ball Grid Array Package Fabrication with IC Die Support Structures," Ser. No. 10/284,349, filed on Oct. 31, 2002;

"Ball Grid Array Package with Multiple Interposers," Ser. No. 10/284,166, filed on Oct. 31, 2002; and "Ball Grid Array Package with Separated Stiffener Layer," Ser. No. 10/284,366, filed on Oct. 31, 2002.

BACKGROUND OF THE INVENTION

1. Field of the Invention

The invention relates generally to the field of integrated circuit (IC) device packaging technology and, more particularly, to substrate stiffening and heat spreading techniques in ball grid array (BGA) packages.

2. Background Art

Integrated circuit (IC) dies are typically mounted in or on a package that facilitates attachment to a printed circuit board (PCB). One such type of IC die package is a ball grid array (BGA) package. BGA packages provide for smaller footprints than many other package solutions available today. A BGA package has an array of solder balls located on a bottom external surface of a package substrate. The solder balls are reflowed to attach the package to the PCB. In one type of BGA package, the IC die is mounted to a top surface of the package substrate. Wire bonds typically couple signals in the IC die to the substrate. The substrate has internal routing which electrically couples the IC die signals to the solder balls on the bottom substrate surface.

A number of BGA package substrate types exist, including ceramic, plastic, and tape (also known as "flex"). In some BGA package types, a stiffener may be attached to the substrate to supply planarity and rigidity to the package. In such packages, the IC die may be mounted to the stiffener instead of the substrate. Openings in the stiffener may be used to allow the IC die to be wire-bonded to the substrate.

Die-up and die-down BGA package configurations exist. In die-up BGA packages, the IC die is mounted on a top surface of the package, opposite of the side to which the solder balls are attached. In die-down BGA packages, the IC die is mounted on a bottom surface of the package, on the same side as which the solder balls are attached.

Conventional BGA packages are subject to high thermal stresses that result from the heat given off during operation of the mounted IC die. The thermal stresses are primarily imposed on the IC die and solder balls due to the mismatch of the thermal expansion coefficient (CTE) between the semiconductor die and the metal stiffener. As a result, conventional flex BGA packages have difficulty in meeting reliability requirements for die sizes larger than about 9 mm. See, e.g., Thompson, T., et al., *Reliability Assessment of a Thin (Flex) BGA Using a Polyimide Tape Substrate*, International Electronics Manufacturing Technology Symposium, IEEE, pp. 207-213 (1999).

The tape substrate used in flex BGA packages is typically polyimide, which has very low values of thermal conductivity. Consequently, the IC die is separated from the PCB internally by the tape substrate thermal barrier. The lack of direct thermal connection from IC die to PCB leads to relatively high resistance to heat transfer from IC die-to-board (theta-jb).

A stiffener attached to a substrate enhances heat spreading. However, the openings on the stiffener for wire bond connections tend to reduce the thermal connections between the IC die and the edges of the stiffener. As a result, heat spreading is limited largely to the region of the IC die attach pad, while areas at the stiffener peripheral do not contribute effectively to heat spreading.

Furthermore, because of the high density of the substrate routing circuitry, it is difficult to bond each power and ground pad on the IC die to the substrate by a corresponding bond finger. As a result, the distribution of ground and power signals connecting to the IC die is frequently compromised in conventional BGA packages.

Ball grid array packages that use plastic substrates (for example, BT or FR4 plastic) are commonly known as plastic BGAs, or PBGAs. See, e.g., Lau, J. H., *Ball Grid Array Technology*, McGraw-Hill, New York, (1995). A PBGA package, for example, may add solder balls to the bottom substrate surface under the IC die to aid in conducting heat to the PCB. Solder balls such as these are referred to as thermal balls. The cost of the PBGA package, however, will increase with the number of thermal balls. Furthermore, a large array of thermal balls may be necessary for heat dissipation into the PCB for high levels of IC device power.

Hence, what is needed are BGA packages with improved heat spreading capabilities, while also providing for high levels of IC electrical performance.

Furthermore, what is needed are improved BGA packages with enhanced electrical, thermal and physical characteristics.

BRIEF SUMMARY OF THE INVENTION

Ball grid array (BGA) packages having enhanced electrical, thermal, and mechanical characteristics are described herein. In an aspect of the present invention, a stiffener for use in a ball grid array (BGA) package is described. The stiffener includes a first surface and a second surface opposed to the first surface. A through-pattern is present through the stiffener. A recessed step region is present in the first surface along an edge of the through-pattern.

In a further aspect of the present invention, the edge is a closest edge of the through-pattern to a central region of the first surface of the stiffener.

In an aspect of the present invention, the through-pattern is an opening through the stiffener that is open at the first surface and the second surface.

In a further aspect, a plurality of openings are present through the stiffener that are open at the first surface and the second surface. A plurality of recessed step regions are present in the first surface. Each of the plurality of recessed step regions is located along an edge of a corresponding opening of the plurality of openings.

In another aspect of the present invention, the through-pattern is a recessed edge portion in an edge of the stiffener.

In a further aspect, a plurality of recessed edge portions are present in one or more edges of the stiffener. A plurality of recessed step regions are present in the first surface. Each of the plurality of recessed step regions is located along an edge of a corresponding recessed edge portion of the plurality of recessed edge portions.

In another aspect of the present invention, one or more recessed step regions are plated with a plating material. In a still further aspect, an area of the first surface adjacent to the recessed step region is plated with the plating material. The plating material may be electrically conductive. In an aspect, the plating material of the recessed step region and area of the first surface adjacent to the recessed step region are coupled together.

In another aspect of the present invention, a BGA package incorporating a stepped stiffener is described. An IC die is mounted on a first surface of the stiffener. A first surface of a substrate is attached to a second surface of the stiffener that is opposed to the first surface of the stiffener. A bond pad of the IC die is coupled to a contact pad on the first surface of the substrate with a wire bond. The wire bond is coupled over a recessed step region in the first surface of the stiffener and through a through-pattern in the stiffener that has an edge adjacent to the recessed step region.

In embodiments of the present invention, the through-pattern in the stiffener is one of an opening through the stiffener, a recessed portion in an edge of the stiffener, or other through-pattern.

Further aspects, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1A:
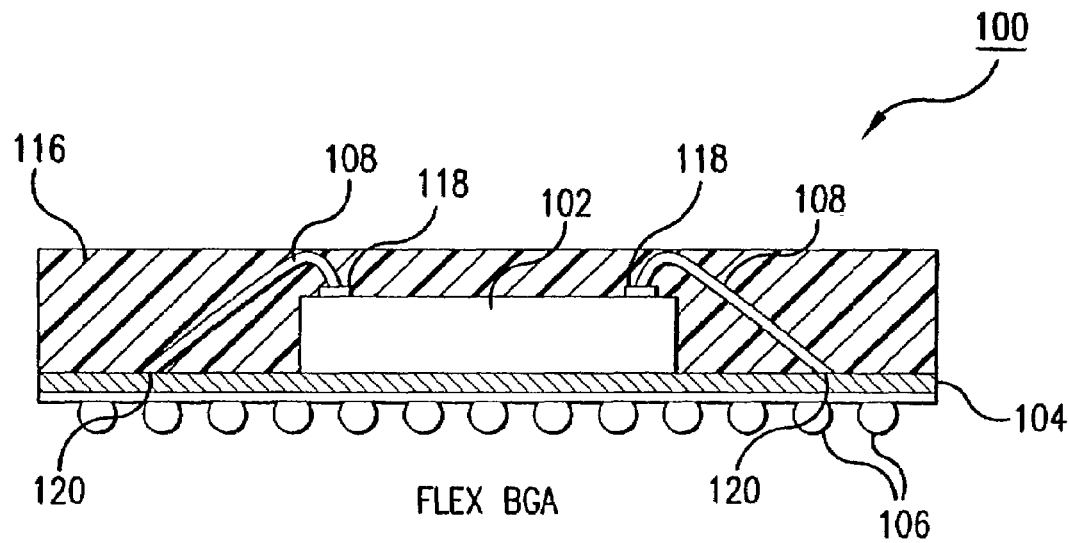
FIGS. 1A and 1B illustrate cross-sectional views of flex BGA packages.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Overview

The present invention is directed to a method and system for improving the mechanical, thermal, and electrical performance of BGA packages. The present invention is applicable to all types of BGA substrates, including ceramic, plastic, and tape (flex) BGA packages. Furthermore the present invention is applicable to die-up (cavity-up) and die-down (cavity-down) orientations.

Numerous embodiments of the present invention are presented herein. First, ball grid array package types are described below. Further detail on the above described embodiments for stepped stiffeners, and additional embodiments according to the present invention, are then described. The embodiments described herein may be combined, as required by a particular application.

Ball Grid Array (BGA) Package

A ball grid array (BGA) package is used to package and interface an IC die with a printed circuit board (PCB). BGA packages may be used with any type of IC die, and are particularly useful for high speed ICs. In a BGA package, solder pads do not just surround the package periphery, as in chip carrier type packages, but cover most or all of the bottom package surface in an array configuration. BGA packages are also referred to as pad array carrier (PAC), pad array, land grid array, and pad-grid array packages. BGA packages types are further described in the following paragraphs. For additional description on BGA packages, refer to Lau, J. H., *Ball Grid Array Technology*, McGraw-Hill, N.Y., (1995), which is herein incorporated by reference in its entirety.

Die-up and die-down BGA package configurations exist. In die-up BGA packages, the IC die is mounted on a top surface of the substrate or stiffener, in a direction away from the PCB. In die-down BGA packages, the IC die is mounted on a bottom surface of the substrate or stiffener, in a direction towards the PCB.

A number of BGA package substrate types exist, including ceramic, plastic (PBGA), and tape (also known as "flex") (for example, refer to Hayden, T. F., et al., *Thermal & Electrical Performance and Reliability Results for Cavity-Up Enhanced BGAs*, Electronic Components and Technology Conference, IEEE, pp. 638-644 (1999), which is incorporated herein by reference). FIG. 1A illustrates a flex BGA package 100. Flex BGA package 100 includes an IC die 102, a tape substrate 104, a plurality of solder balls 106, and one or more wire bonds 108. Tape or flex BGA packages are particularly appropriate for large IC dies with large numbers of inputs and outputs, such as application specific integrated circuits (ASIC) and microprocessors.

Tape substrate 104 is generally made from one or more conductive layers bonded with a dielectric material. For instance, the dielectric material may be made from various substances, such as polyimide tape. The conductive layers are typically made from a metal, or combination of metals, such as copper and aluminum. Trace or routing patterns are made in the conductive layer material. Substrate 104 may be a single-layer tape, a two-layer tape, or additional layer tape substrate type. In a two-layer tape, the metal layers sandwich the dielectric layer, such as in a copper-Upilex-copper arrangement.

IC die 102 is attached directly to substrate 104, for example, by an epoxy. IC die 102 is any type of semiconductor IC.

One or more wire bonds 108 connect corresponding bond pads 118 on IC die 102 to contact pads or points 120 on substrate 104.

An encapsulate 116, such as a mold compound, epoxy, or other encapsulating material, covers IC die 102 and wire bonds 108 for mechanical and environmental protection.

Figure 1B:
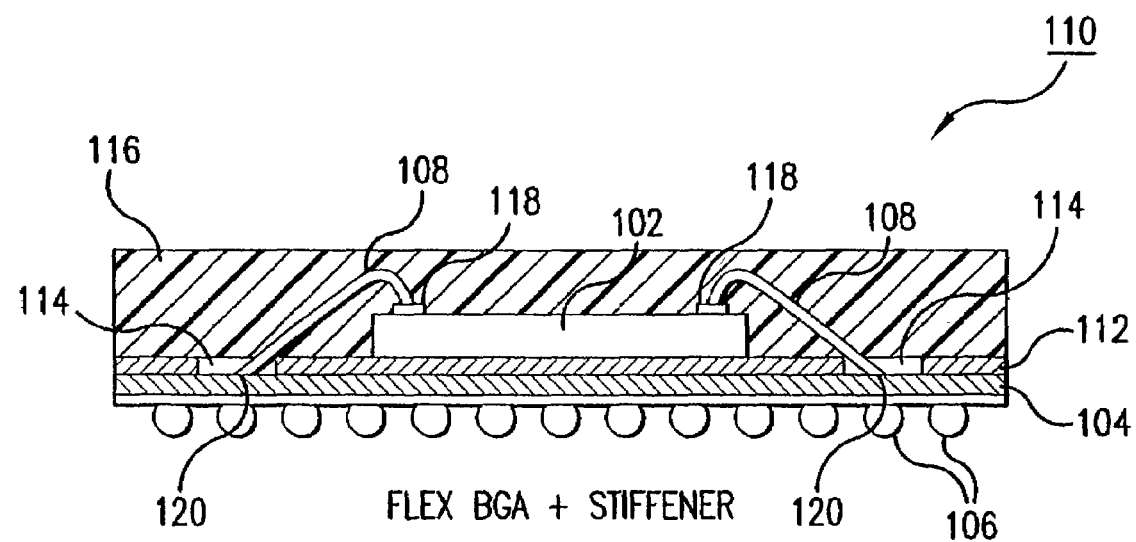

As shown in FIG. 1A, flex BGA package 100 does not include a stiffener. In some BGA package types, particularly in flex BGA packages, a stiffener can be attached to the substrate to add planarity and rigidity to the package. FIG. 1B illustrates a flex BGA package 110, similar to flex BGA package 100, that incorporates a stiffener 112. Stiffener 112 may be laminated or otherwise attached to substrate 104. Stiffener 112 is typically made from a metal, or combination of metals, such as copper, tin, and aluminum, or may be made from a polymer, for example. Stiffener 112 also may act as a heat sink, and allow for greater heat spreading in BGA package 110. One or more openings 114 in stiffener 112 may be used to allow for wire bonds 108 to connect IC die 102 to substrate 104. Stiffener 112 may be configured in other ways, and have different opening arrangements than shown in FIG. 1B.

Figure 2A:
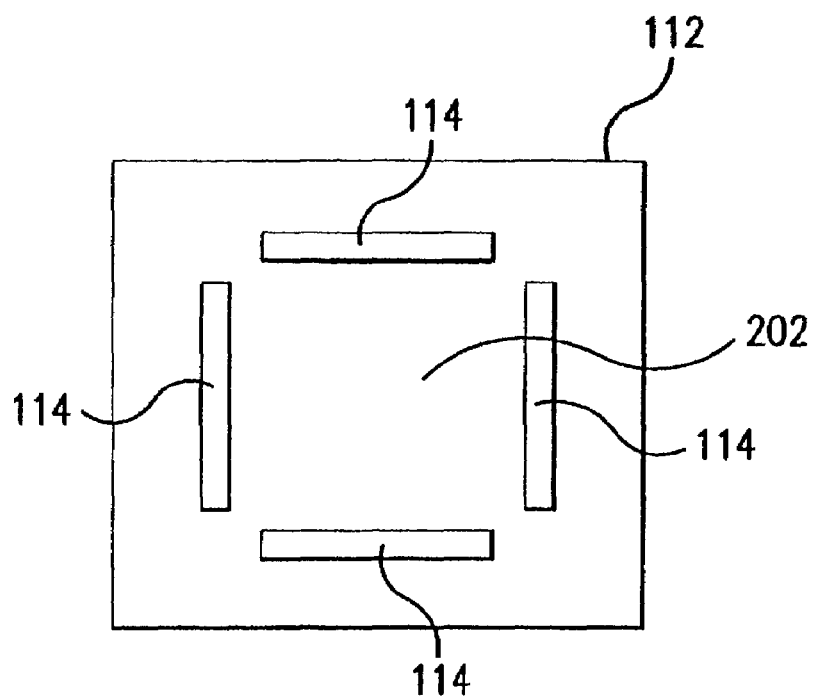
FIG. 2A shows a top view of a stiffener.
Figure 2B:
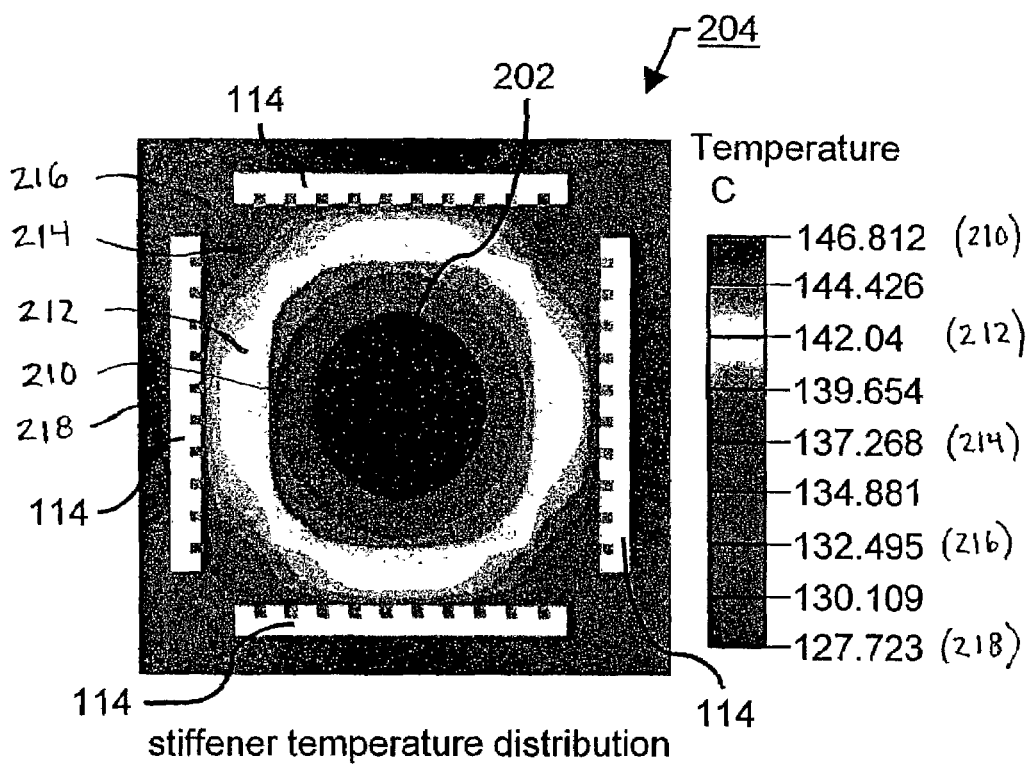
FIG. 2B shows a temperature distribution for a stiffener during operation of an IC device in a flex BGA package.

The use of a stiffener in a flex BGA package requires additional considerations when attempting to manage heat spreading. FIG. 2A shows a top view of a stiffener 112. Stiffener 112 includes an opening 114 adjacent to all four sides of an IC die mounting position 202 in the center of stiffener 112. FIG. 2B shows a temperature distribution 204 of a stiffener, such as stiffener 112, during operation of an IC die in a flex BGA package. Temperature distribution 204 shows that heat transfer from IC die mounting position 202 to the edges of stiffener 112 is substantially limited by openings 114. Openings 114 act as thermal barriers to heat spreading in stiffener 112.

Figure 2C:
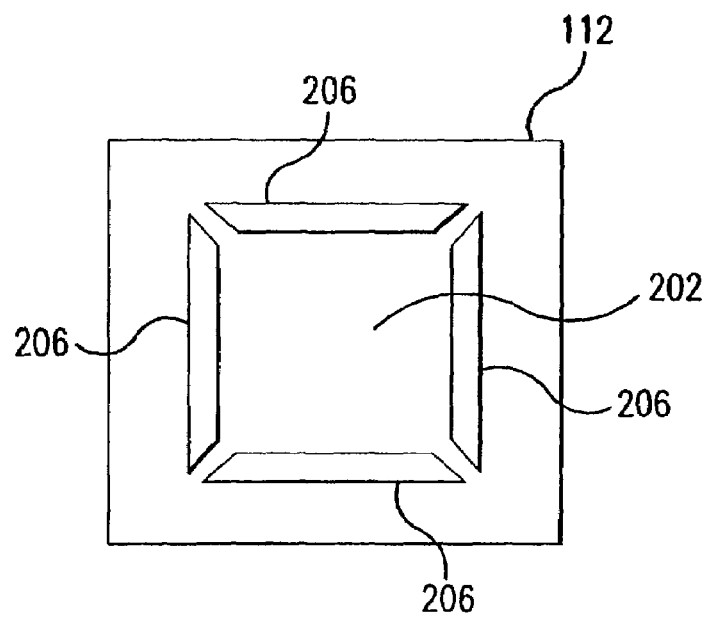
FIG. 2C shows an top view of an alternative stiffener configuration.

FIG. 2C shows a top view of an alternative configuration for stiffener 112, according to an embodiment of the present invention. Stiffener 112 includes an opening 206 adjacent to all four sides of an IC die mounting position 202 in the center of stiffener 112. Openings 206 are similar to openings 114 of FIG. 2A, but have different shape. The different shape can enhance thermal transfer to the outer areas of stiffener 112, for example. Further alternatively shaped openings in stiffener 112 are applicable to the present invention, including elliptical or rounded openings, etc.

Figure 3:
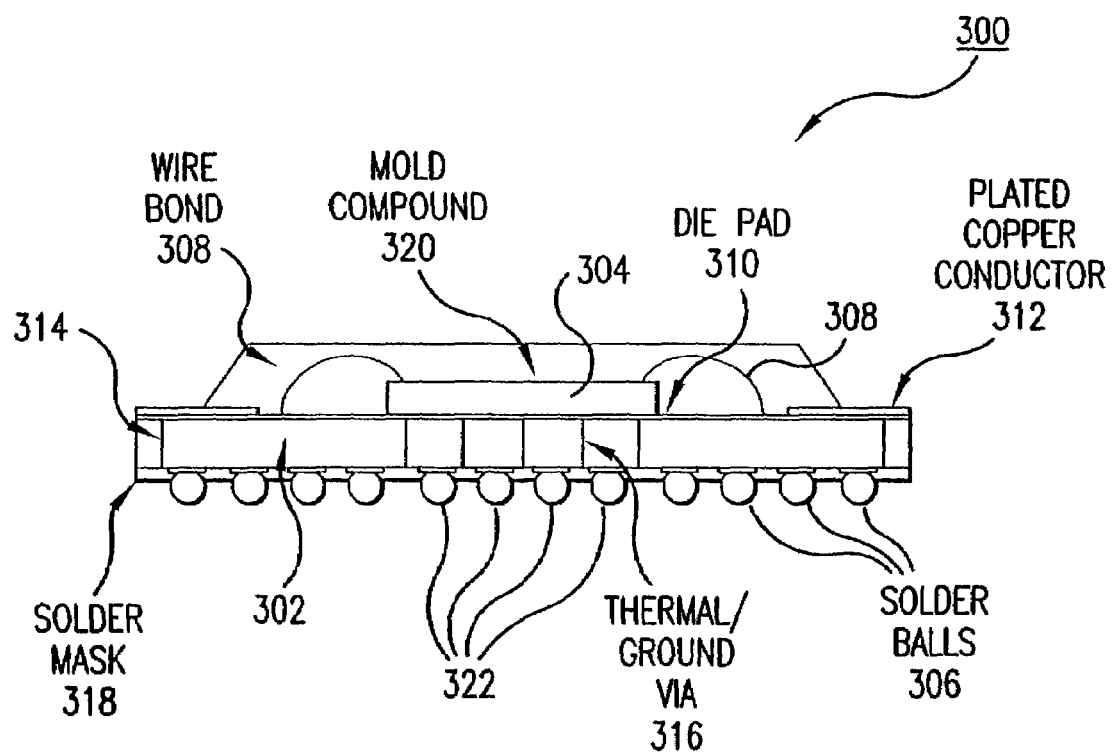
FIG. 3 shows a cross-sectional view of a die-up plastic BGA package.

FIG. 3 shows a cross-sectional view of a conventional die-up PBGA package 300. PBGA package 300 includes a plastic substrate 302, an IC die 304, a plurality of solder balls 306, a plurality of wire bonds 308, a die pad 310, one or more vias 314, and one or more thermal/ground vias 316.

Plastic substrate 302 includes one or more metal layers formed on an organic substrate. For example, plastic or organic substrates may include materials such as "BT", which includes a resin called bis-maleimide triazine, and/or "FR-4," which is a fire-retardant epoxy resin-glass cloth laminate material, and/or other similar materials. IC die 304 is mounted to die pad 310. IC die 304 may be attached to die pad 310 with an epoxy, such as a silver-filled epoxy. Wire bonds 308 connect signals of IC die 304 to substrate 302. For instance, gold bonding wire is bonded from aluminum bond pads on IC die 304 to gold-plated contact pads on substrate 302. The contact pads on substrate 302 connect to solder balls 306 attached to the bottom surface of substrate 302, through vias 314 and routing within substrate 302 using copper conductors 312. Thermal/ground vias 316 connect die pad 310 to one or more thermal/ground balls 322 on the center bottom surface of substrate 302. An encapsulate, mold compound, or epoxy 320 covers IC die 304 and wire bonds 308 for mechanical and environmental protection.

Figure 4A:
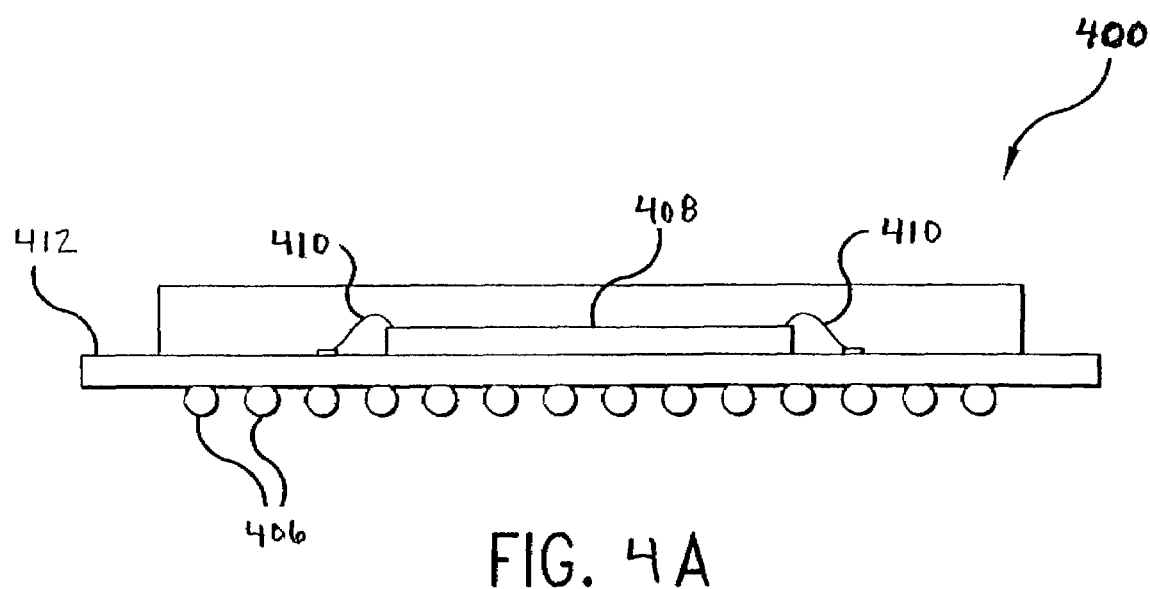
FIG. 4A illustrates a cross-sectional view of a die-up BGA package.
Figure 4B:
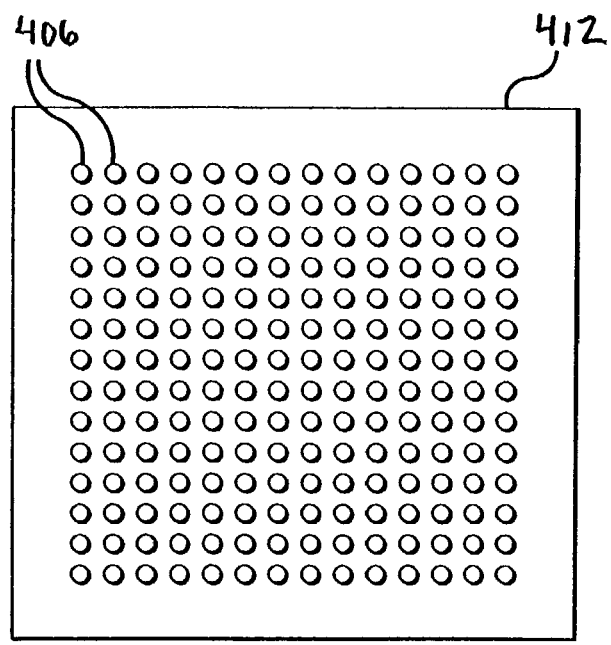
FIGS. 4B and 4C illustrate exemplary solder ball arrangements for the die-up BGA package of FIG. 4A.
Figure 4C:
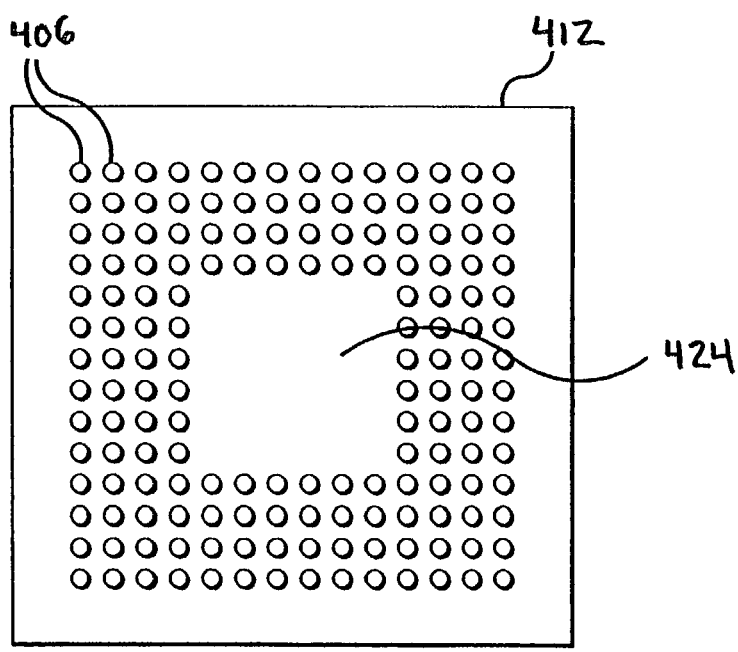

As described above, a BGA package includes an array of solder balls located on a bottom external surface of the package substrate. FIG. 4A illustrates a cross-sectional view of a die-up BGA package 400. FIGS. 4B and 4C illustrate exemplary solder ball arrangements for die-up BGA package 400. As shown in FIG. 4A, BGA package 400 includes an IC die 408 mounted on a substrate 412. IC die 408 is electrically connected to substrate 412 by one or more wire bonds 410. Wire bonds 410 are electrically connected to solder balls 406 underneath substrate 412 through corresponding vias and routing in substrate 412. The vias in substrate 412 can be filled with a conductive material, such as solder, to enhance these connections. Solder balls 406 are attached to substrate 412, and are used to attach the BGA package to a PCB.

Note that although wire bonds, such as wire bonds 410, are shown and described herein, IC dies may be mounted and coupled to a substrate with solder balls located on the bottom surface of the IC die, by a process commonly referred to as "C4" or "flip chip" packaging.

As shown in FIG. 4B, solder balls 406 may be arranged in an array. FIG. 4B shows a 14 by 14 array of solder balls on the bottom surface of BGA package 400. Other sized arrays of solder balls are also applicable to the present invention. Solder balls 406 are reflowed to attach BGA package 400 to a PCB. The PCB may include contact pads to which solder balls 406 are bonded. PCB contact pads are generally made from a metal or combination of metals, such as copper, nickel, tin, and gold.

FIG. 4C shows a bottom view of BGA package 400, with an alternative solder ball array arrangement. BGA package 400 attaches an array of solder balls 406 on a bottom surface of substrate 412. As shown in FIG. 4C, solder balls 406 are located in a peripheral area of the bottom surface of substrate 412, away from a substrate center 424. For example, solder balls 406 on the bottom surface of substrate 412 may be located outside an outer profile area of an IC die mounted on the opposite surface of substrate 412. The solder ball array may be organized in any number of ways, according to the requirements of the particular BGA package application.

The solder ball arrangement shown in FIG. 4C is particularly applicable to embodiments of the present invention described below, such as for attaching a heat spreader/heat sink/heat slug/thermal connector to a bottom surface of a BGA package. The heat spreader/heat sink/heat slug/thermal connector may be connected in substrate center 424, for example.

Figure 5:
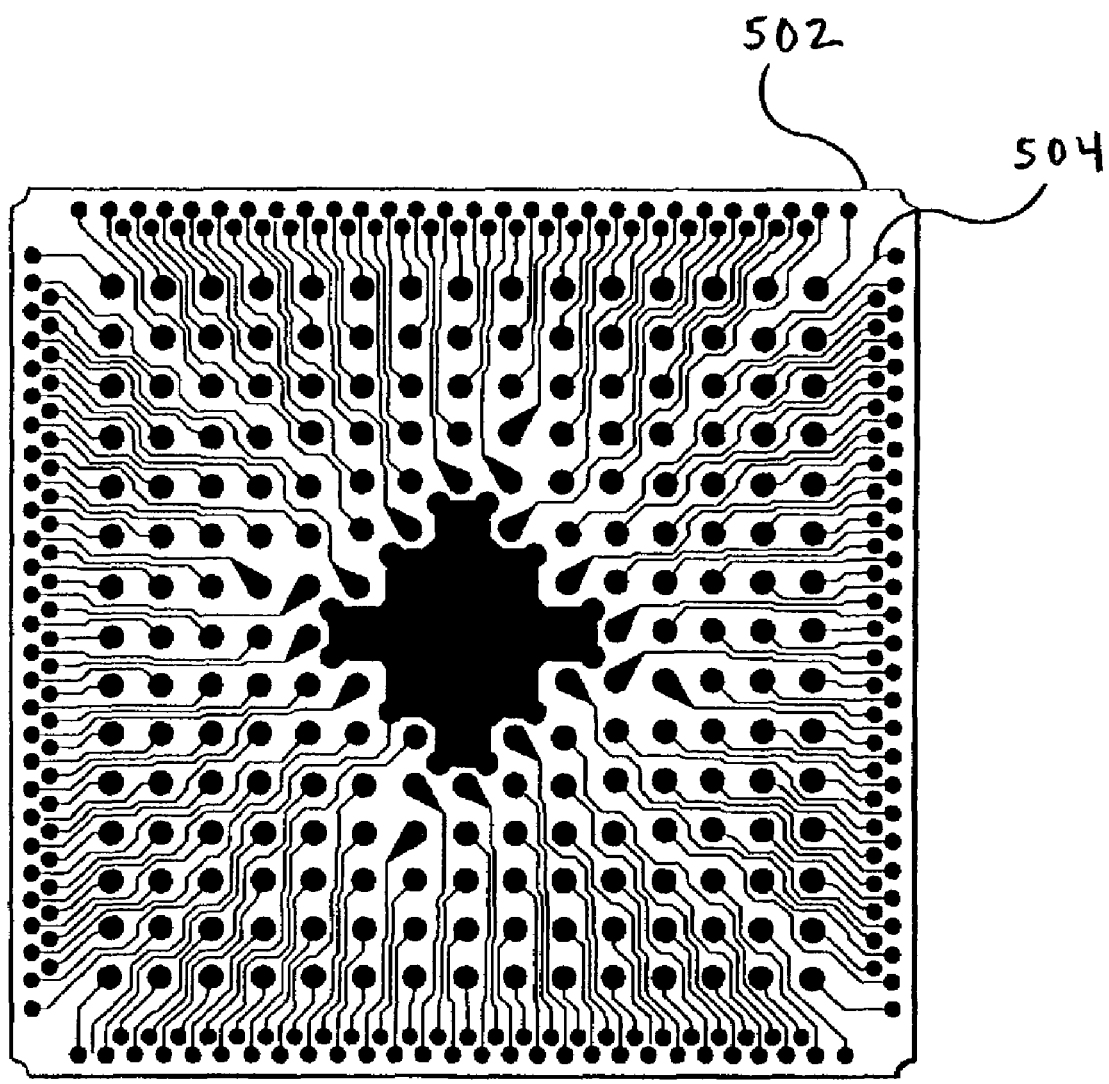
FIG. 5 shows exemplary routing in a substrate layer.

As described above, the BGA package substrate provides electrically conductive vias and routing on one or more electrically conductive layers to connect contact pads for wire bonds on its upper surface to solder balls attached to the bottom substrate surface. For illustrative purposes, FIG. 5 shows solder ball pads and routing 504 in an example bottom substrate layer 502.

The present invention is applicable to improving thermal, mechanical, and electrical performance in the BGA package types described herein, and further BGA package types.

High routing density in substrate 104/302 can make it difficult to bond each power and ground pad of IC die 102/304 to a corresponding contact pad on the top surface of substrate 104/302. As a result, the coupling of ground and power signals from IC die 102/304 to substrate 104/302 may be compromised, particularly in tape substrate BGA packages. The presence of a stiffener, such as stiffener 112, to stiffen a BGA package limits the area of the package substrate to which wire bonds may be coupled from the IC die. This problem is exacerbated by the edges of openings in a stiffener, such as openings 114 in stiffener 112, which have to be traversed by wire bonds. The present invention provides additional space for the traversal of wire bonds, as described below.

Stepped Stiffener Embodiments

According to the embodiments of the present invention, thermal, electrical, and mechanical enhancements to a BGA package are provided, through the introduction of a stepped stiffener. This section provides embodiments and description of the stepped stiffener of the present invention. For illustrative purposes, the present invention is described below in the context of the elements of BGA packages 100 and 110 of FIGS. 1A and 1B, but is not limited to these examples. The stepped stiffener of the present invention is applicable to tape and plastic substrate BGA packages, such as BGA packages 100, 110, and 300 described above, to ceramic substrate BGA packages, and further BGA package types.

Figures 6A, 6B:
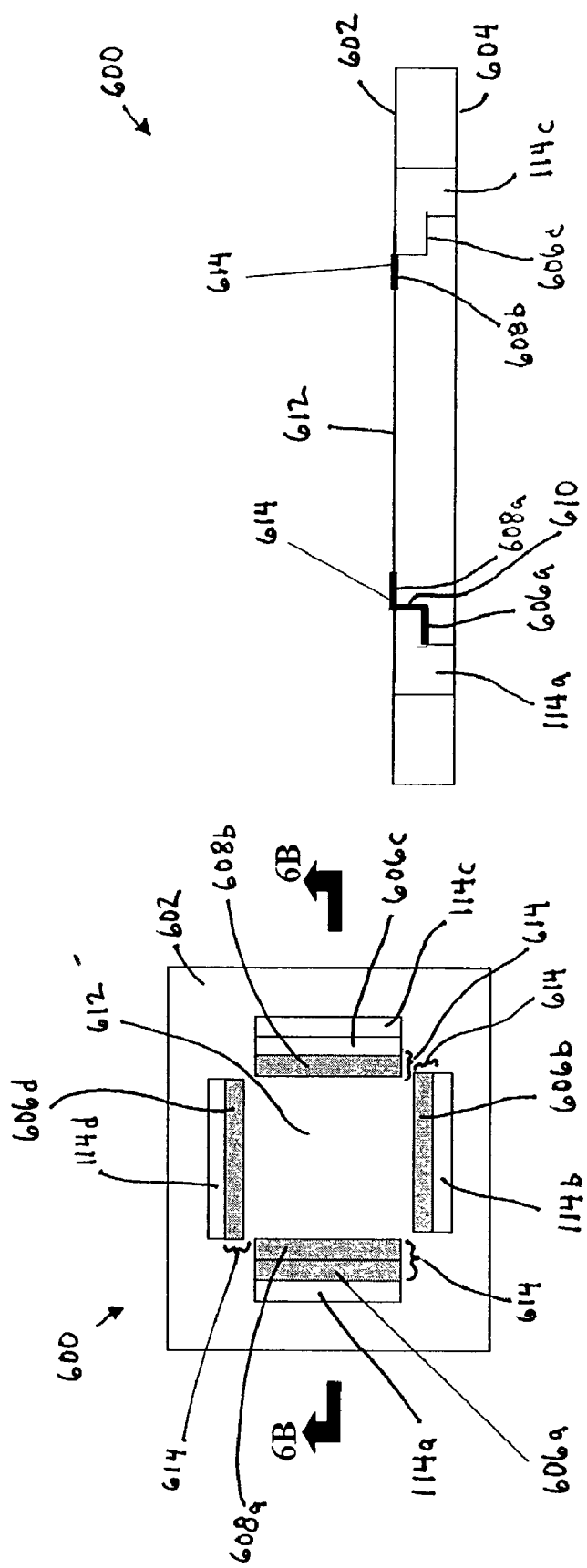
FIGS. 6A and 6B show top and cross-sectional views, respectively, of a stepped stiffener, according to an example embodiment of the present invention.

FIGS. 6A and 6B show top and side views, respectively, of an example stiffener 600, according to an embodiment of the present invention. Stiffener 600 is substantially similar to stiffener 112, with the addition of "steps", as described herein. Hence, stiffener 600 may also be referred to as an "interposer." Stiffener 600 provides mechanical support and stiffness for the BGA package in which it resides. Furthermore, in embodiments, stiffener 600 is thermally conductive and provides for heat spreading. In such embodiments, stiffener 600 conducts heat away from an IC die centrally mounted to stiffener 600 in a central region 612. Hence, stiffener 600 may also be referred to as a heat sink, heat slug, and heat spreader.

As shown in the example of FIG. 6A, stiffener 600 has a substantially planar top surface 602. Stiffener 600 further has a substantially planar bottom surface 604, which is opposed to top surface 602, as indicated in FIG. 6B. However, stiffener 600 also includes a plurality of openings 114, each with a corresponding recessed step region 606 located alongside in first surface 602. Recessed step region 606 facilitates connection of one or more wire bonds between an IC die to the package substrate through or around stiffener 600. According to embodiments of the present invention, recessed step region 606 reduces an edge blocking effect of opening 114 to a wire bond caused by the thickness of stiffener 600. Recessed step region 606 reduces a risk of wire bond contact with stiffener 600 during an IC die encapsulation process. Recessed step region 606 can also lead to a wire bond length reduction for wire bonds passing through a corresponding opening 114, and can therefore improve the electrical performance of the BGA package. Recessed step region 606 can be patterned into stiffener 600 by processes such as stamping, half etching, machining, molding, and other metal and material forming processes.

Openings 114 allow for wire bonds to pass through stiffener 600 to couple to the package substrate, such as shown is in FIG. 1B for stiffener 112. The dimensions of openings 114 can be varied to allow for reduced wire bond lengths, for improved routability of the BGA package substrate, and for improved manufacturability of the BGA package. As will be described below, stiffener 600 may include any combination of one or more through-patterns such as openings 114, recessed edge portions, and other through-patterns described herein, according to embodiments of the present invention.

As shown in the example of FIG. 6A, four openings 114 are present in stiffener 600. Openings 114 are typically located proximate to a central mount location (i.e., central region 612) for the package IC die to allow for relatively short lengths for wire bonds, but may be located anywhere in stiffener 600. As shown in FIG. 6A, each of openings 114 in stiffener 600 is substantially rectangular shaped. In alternative embodiments, openings 114 may have other shapes, including regular shapes such as elliptical or round, any quadrilateral such as trapezoidal, other polygons, combinations thereof, and additional shapes such as irregular.

Figure 6C:
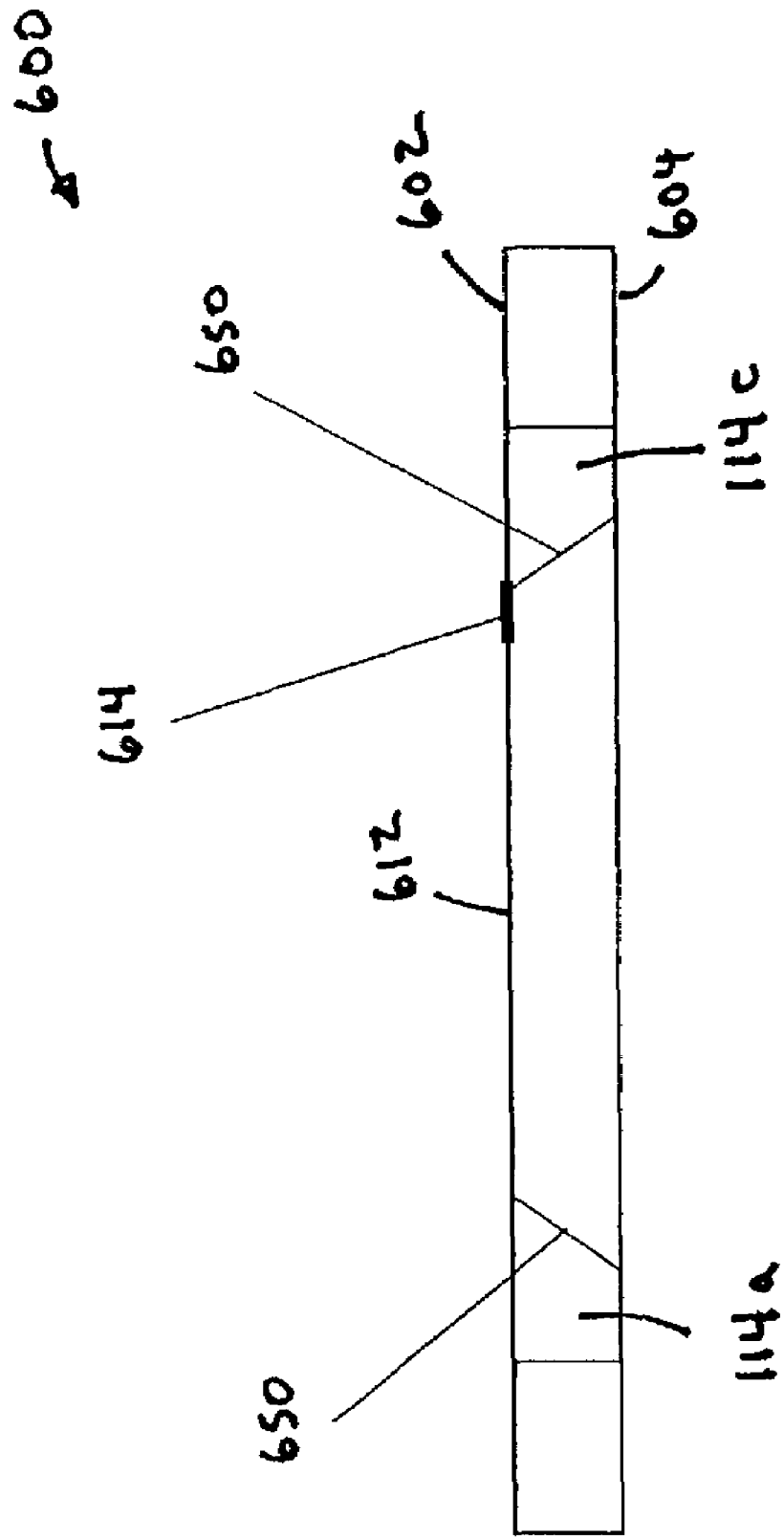
FIG. 6C shows a cross-sectional view of a stiffener with angled surfaces, according to an example embodiment of the present invention.
Figure 6D:
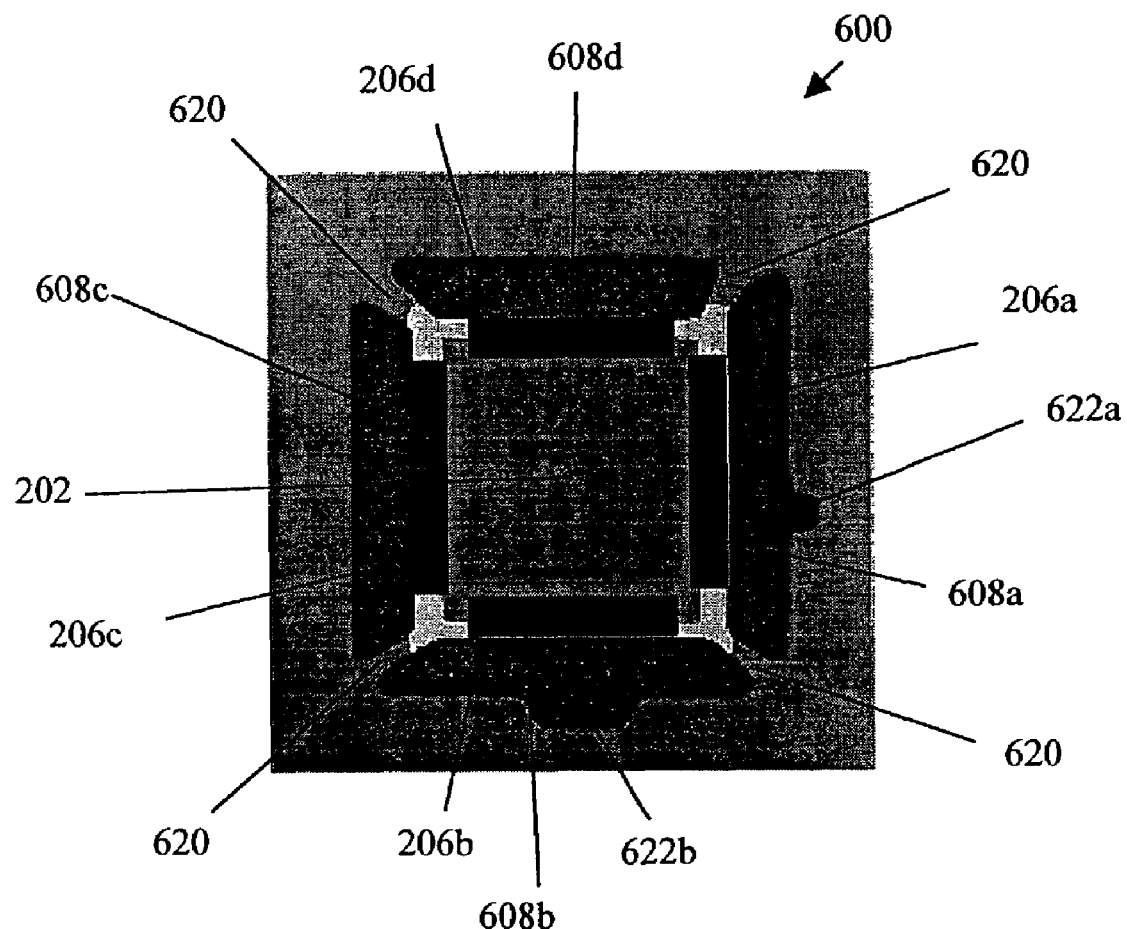
FIG. 6D shows a top view of a stepped stiffener, according to an example embodiment of the present invention.

For example, FIG. 6D illustrates a top view of a stepped stiffener 600 with trapezoidal openings 206a-d, according to an alternative embodiment of the present invention. Stiffener studs or "tie bars" 620 separate openings 206a-d. Furthermore, one or more of openings 206a-d have one or more notches 622. A first opening 206a has a first notch 622a and a second opening 206b has a second notch 622b. Notches 622a and 622b may be used to accommodate wire bonds. Any number and any size notch may be present in an opening of a stepped stiffener of the present invention. Note that one or more plated areas may be plated on stiffener 600 to enhance wire bond connections to stiffener 600. The plating may be silver, gold, other metal, or combination/alloy thereof, for example. Note that openings 206a and 206b may also be considered to be irregular shaped openings, due to each having the combination of a trapezoidal opening and a notch.

As shown in FIG. 6A, a first recessed step region 606a is located along an edge of a first opening 114a, a second recessed step region 606b is located along an edge of a second opening 114b, a third recessed step region 606c is located along an edge of a third opening 114c, and a fourth recessed step region 606d is located along an edge of a fourth opening 114d. Each of first, second, third, and fourth recessed step regions 606a-606d is substantially rectangular in shape. In alternative embodiments, one or more recessed step regions 606 may have other shapes, including regular shapes such as elliptical or round, any quadrilateral such as trapezoidal, other polygons, combinations thereof, and additional shapes such as irregular. Furthermore, one or more recessed step regions 606 may have a surface that is substantially planar or other shape, including rounded, and irregular.

Note that a single recessed step region is located along each of openings 114a-114d in FIG. 6A. In alternative embodiments, a plurality of recessed steps or step regions may be located along one or more of openings 114a-114d.

In other words, a "staircase" of recessed step regions 606 may be located next to a single opening 114, with two steps, three steps, and any number of additional steps. These additional steps may provide additional clearance for wire bond connections.

Furthermore, in a further embodiment, an angled surface 650 may be located along one or more of openings 114a-114d, as shown in FIG. 6C. As shown in FIG. 6C, angled surface 650 is formed between first surface 602 and second surface 604. Angled surface 650 may be used to provide clearance for wire bond connections. As shown in the example of FIG. 6C, angled surface 650 is formed at an acute angle to a plane of first surface 602. Angled surface 650 may formed at any angle to the plane of first surface 600, including any acute angle to the plane of first surface 600.

Recessed step regions 606 may be plated to enhance their mechanical and electrical characteristics. As shown in FIGS. 6A and 6B, first, second, and fourth recessed step regions 606a, 606b, and 606d are plated with a plating material 614. For example, plating material 614 may be an electrically conductive material. The electrically conductive material may include one or more metals, including gold, silver, solder, nickel, tin, copper, aluminum, and other metals and alloys, and may include other conductive materials. Plating material 614 may enhance the electrical and/or mechanical connection of a wire bond to the particular recessed step portion 606.

Furthermore, areas along or adjacent to recessed step regions 606 may also be plated with plating material 614. For example, as shown in FIG. 6A and 6B, an area 608a of top surface 602 located along first recessed step region 606a is plated with plating material 614. Also, an area 608b of top surface 602 along third recessed step region 606c is plated with plating material 614. Areas 608a and 608b are shown to be of rectangular shape, but may have other shapes. Furthermore, as shown in the example of FIG. 6B, a surface area 610 between recessed step region 606a and area 608a is plated with plating material 614. Areas 608a, 608b, and 610 may be plated for similar reasons to the reasons for plating recessed step regions 606, and may be plated with similar materials. Furthermore, by plating recessed step region 606a, areas 608a, and area 610, an electrical connectivity between these locations may be enhanced, which may be important when stiffener 600 is not otherwise electrically conductive.

Figure 7:
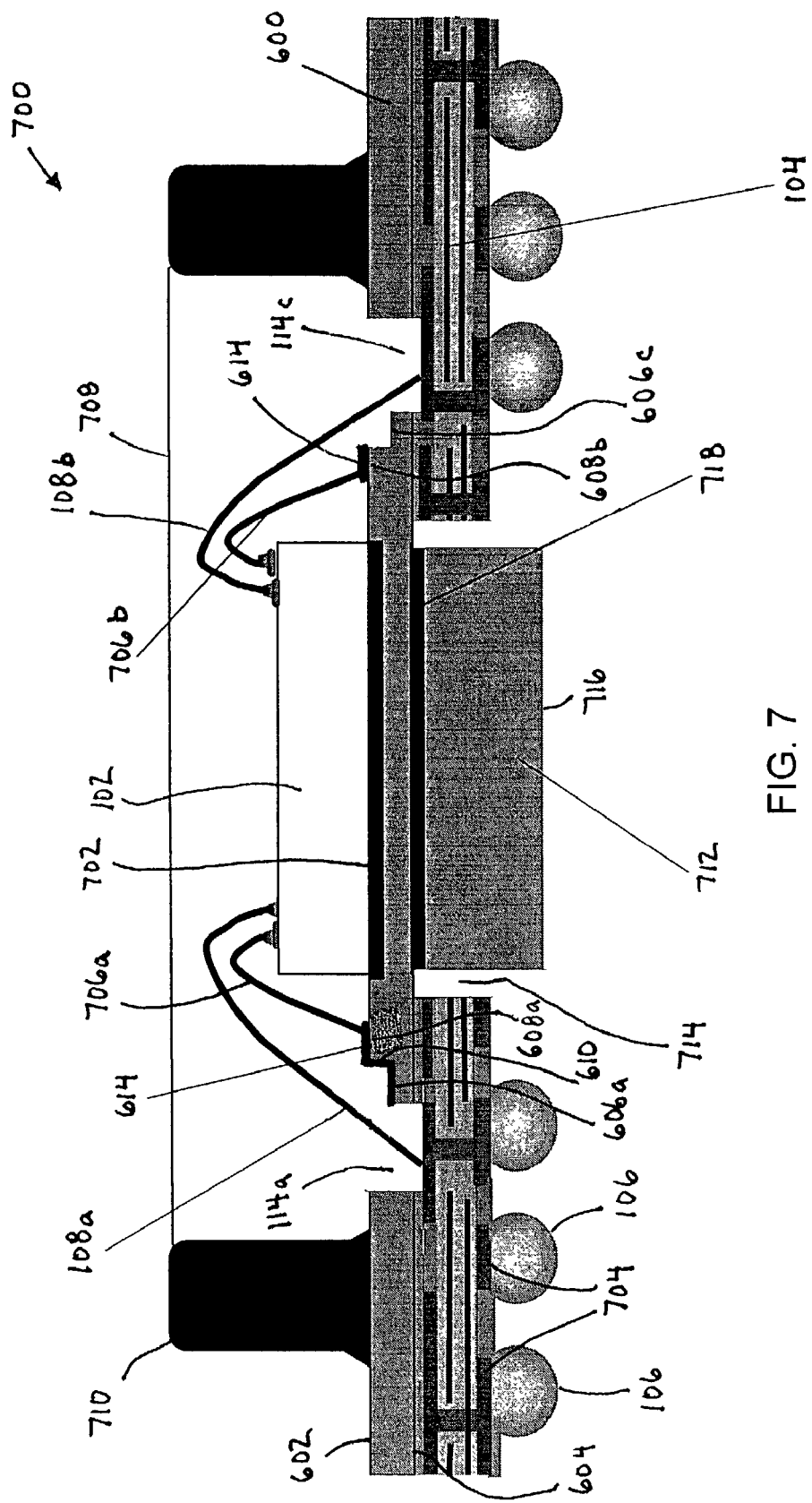
FIG. 7 shows a cross-sectional view of a BGA package with the stepped stiffener of FIGS. 6A and 6B, according to an example embodiment of the present invention.

FIG. 7 shows an example BGA package 700, according to an embodiment of the present invention. BGA package 700 includes example stiffener 600 as shown in FIGS. 6A and 6B.

As shown in FIG. 7, IC die 102 is mounted to central region 612 of top surface 602 of stiffener 600 by an adhesive material 702. In embodiments, adhesive material 702 may be a thermally conductive adhesive material, to enhance transfer of heat from IC die 102 to stiffener 600. For instance, adhesive material 702 may be an epoxy, such as a silver-filled epoxy, a laminate, such as a film or tape adhesive, a solder, and other adhesive material.

Bottom surface 604 of stiffener 600 is coupled to atop surface of substrate 104. A plurality of solder ball pads 704 on the bottom surface of substrate 104 have a respective plurality of solder balls 106 attached thereto. Solder ball pads 704 are electrically coupled through substrate 104 to contact pads/lands on the top surface of substrate 104. Conductive areas/lands/fingers/traces/etc. on the top surface of substrate 104 that are wire bond attachable are referred to herein as "contact pads." Substrate 104 can be BT, tape, organic, ceramic, glass, laminated, build-up, and any other substrate type, such as those otherwise described herein, for example.

An encapsulate 708 is used to encapsulate IC die 102 and wire bonds on the top surfaces of stiffener 600 and substrate 104. For BGA package 700, encapsulate 708 is shown in the form of a "glob top." In a glob top encapsulation embodiment, an encapsulating material is applied in a cavity formed by substrate 104/stiffener 600 and a dam 710. Dam 710 may be a material, such as an epoxy, that is formed in a ring to contain the encapsulating material when it is later applied. However, in the embodiments described herein, encapsulate 708 may be any form and type of encapsulation/encapsulating material, including glob top, molding compound, saw singulation, and epoxy, for example.

As shown in FIG. 7, one or more wire bonds 108 are coupled from bond pads on IC die 102 over recessed step region(s) 606 and through openings 114 to contact pads on the top surface of substrate 104. For example, as shown in FIG. 7, a first wire bond 108a and a second wire bond 108b are coupled from bond pads on IC die 102 to contact pads on the top surface of substrate 104. First wire bond 108a passes over first recessed step region 606a and through wire bond opening 114a. Second wire bond 108b passes over third recessed step region 606c and through wire bond opening 114c. In embodiments, any number of wire bonds 108 may pass over a recessed step region 606, and be coupled through a wire bond opening 114. As described above, recessed step region 606 reduces a risk of contact of wire bonds 108 with stiffener 600 during encapsulation of IC die 102, among other advantages.

Furthermore, in embodiments, one or more wire bonds 706 are coupled from bond pads on IC die 102 to stiffener 600. For example, wire bonds 706 may couple from bond pads on IC die 102 that are coupled to power, ground, or some other signal internal to IC die 102. Thus, wire bonds 706 couple these signals to stiffener 600, which may then operate as a ground, power, or signal plane to enhance electrical performance of BGA package 700. For example, as shown in FIG. 7, a first wire bond 706a is coupled from a bond pad on IC die 102 to area 608a on top surface 602 of stiffener 600. A second wire bond 706b is coupled from a bond pad on IC die 102 to area 608b on top surface 602 of stiffener 600. Areas 608a and 608b are plated with plating material 614 to enhance the mechanical and electrical connection of first and second wire bonds 706a and 706b, respectively, to stiffener 600. Areas 608a and 608b may be electrically connected or isolated from one another. Although not shown in FIG. 7, one or more wire bonds 706 may additionally or alternatively be coupled from IC die 102 to recessed step regions 606.

As shown in FIG. 7, an optional thermal connector 712 is attached to bottom surface 604 of stiffener 600, through a corresponding optional window opening 714 in substrate 104. When present, a bottom surface 716 of thermal connector 712 may be attached to a PCB when BGA package 700 is mounted to the PCB. Thermal connector 712 enhances the conduction of heat from IC die 102 through stiffener 600, to the PCB. Furthermore, thermal connector 712 may be coupled to a conductive area of the PCB to provide an enhanced electrical connection for ground, power, or some other signal to the PCB. In embodiments, thermal connector 712 is made from a metal, such as aluminum, copper, and other metals or alloys, for example. Thermal connector 712 may also be referred to as a heat slug, heat spreader, and heat sink, due to its thermal characteristics.

An adhesive material 718 is used to attach thermal connector 712 to bottom surface 704. In embodiments, adhesive material 718 is an electrically and/or thermally enhanced adhesive material to enhance the electrical and thermal characteristics of thermal connector 712. For example, adhesive material 718 may be an epoxy, such as a silver-filled epoxy, a laminate, such as a film or tape adhesive, a solder, and other adhesive material.

Furthermore, a sealant material may be used to fill a gap between thermal connector 712 and substrate 104 in opening 714. The sealant material is formed in a ring around thermal connector 712, and therefore is also referred to as a seal ring. In an embodiment, the sealant material is a dielectric sealant, an epoxy, or other electrically non-conductive sealing material. The seal ring formed by the sealant material improves a BGA package resistance to moisture, BGA package manufacturing yields, BGA package reliability, as well as additional BGA package thermal and mechanical performances.

In an alternative embodiment, the sealant material is an electrically conductive material that can electrically couple thermal connector 712 to one or more electrically conductive traces, rings, and/or planes of substrate 104, that are coupled to an electrical potential. Such an embodiment provides additional flexibility for routing of substrate 104, and an improvement in BGA package electrical performance.

Figure 8A:
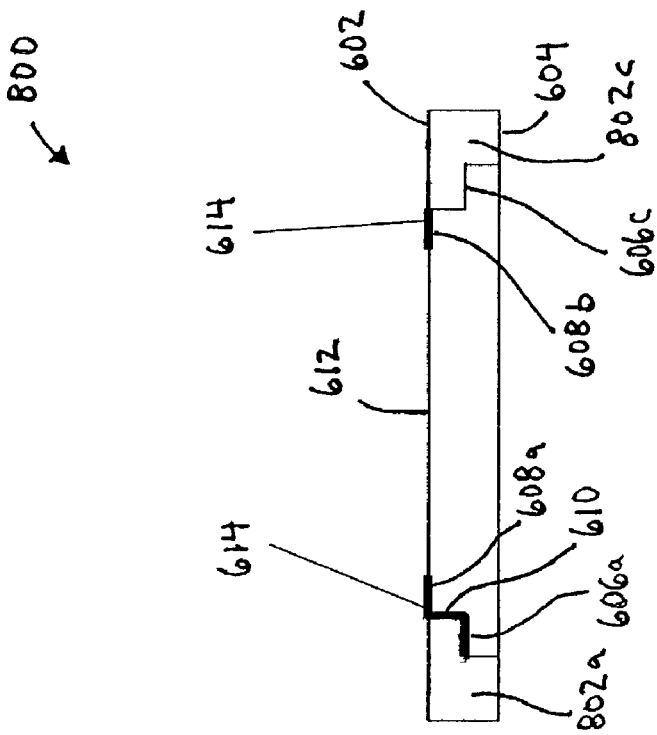
FIGS. 8A and 8B show top and cross-sectional views, respectively, of a stepped stiffener, according to an example embodiment of the present invention.
Figure 8B:
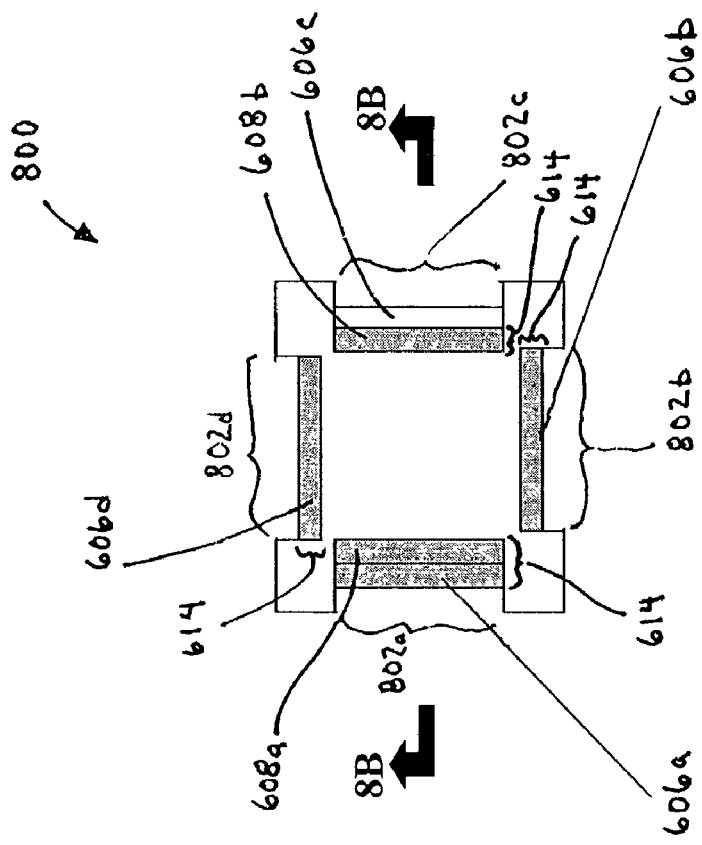

FIGS. 8A arid 8B show top and side views, respectively, of an example stiffener 800, according to a further embodiment of the present invention. Stiffener 800 of FIGS. 8A and 8B is substantially similar to stiffener 600 as shown in FIGS. 6A and 6B, but is configured such that, openings 114 shown in FIGS. 6A and 6B are replaced with recessed edge portions 802. Recessed edge portions 802 are open at the outer edges of stiffener 800, as opposed to openings 114, which are closed.

In embodiments, outer edges of stiffener 600 and 800 may coincide with outer edges of substrate 104, such as is shown for stiffener 600 in FIG. 7. In alternative embodiments, outer edges of stiffener 600 and 800 may not extend to the outer edges of substrate 104, such as is shown for stiffener 800 in FIG. 8.

In embodiments, any number of one or more recessed edge portions 802 may be present in stiffener 800. As shown in the example of FIGS. 8A and 8B, stiffener 800 has a first recessed edge portion 802a in a first edge 804a, a second recessed edge portion 802b in a second edge 804b, a third recessed edge portion 802c in a third edge 804c, and a fourth recessed edge portion 802d in a fourth edge 804d.

In embodiments, any number of one or more recessed step regions 606 may be present in any number of recessed edge portions 802. For example, as shown in FIGS. 8A and 8B, a recessed step region 606 is present in first surface 602 of stiffener 800 along each recessed edge portion 802. First recessed step region 606a is present along first recessed edge portion 802a, second recessed step region 606b is present along second recessed edge portion 802b, third recessed step region 606c is present along third recessed edge portion 802c, and fourth recessed step region 606d is present along fourth recessed edge portion 802d.

Furthermore, similarly to stiffener 600 described above, stiffener 800 may include a staircase and/or an angled surface 650 (shown in FIG. 6C) along one or more of recessed edge portions 802a-802d. A staircase or angled surface 650 may be used to provide clearance for wire bond connections.

As shown in FIG. 8A, each of first, second, third, and fourth recessed edge portions 802a-802d is substantially rectangular in shape. In alternative embodiments, one or more recessed edge portions 802 may have other shapes, including elliptical or round, combinations of rectangular and elliptical, and additional shapes.

Figure 8C:
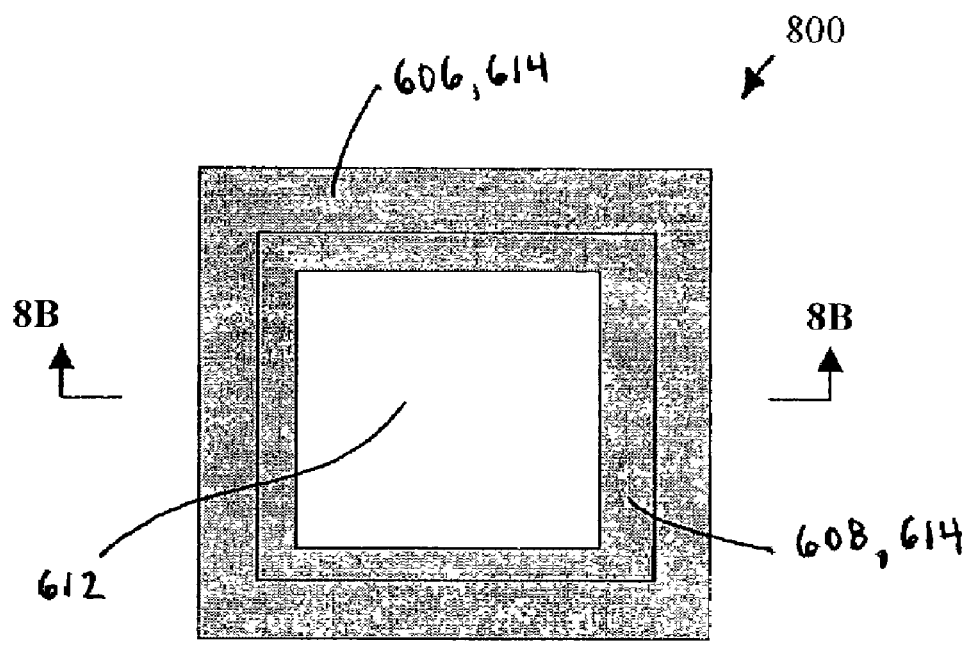
FIGS. 8C and 8D show top and cross-sectional views, respectively, of a stepped stiffener, according to an example embodiment of the present invention.
Figure 8D:
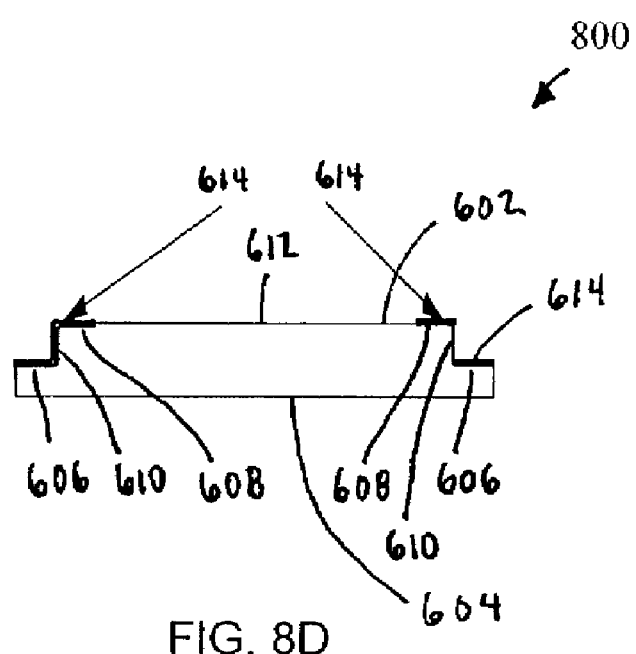

FIGS. 8C and 8D show top and side views, respectively, of stiffener 800, according to a further embodiment of the present invention. Stiffener 800 of FIGS. 8C and 8D is substantially similar to the embodiment shown in FIGS. 8A and 8B, but is configured such that instead of having recessed edge portions 802 as shown in FIGS. 8A and 8B, the entire outer edge of stiffener 800 is recessed. Hence, in this embodiment, stiffener 800 has a continuous recessed step region 608 around its periphery, and the outer edges of stiffener 800 do not coincide with the outer edges of a substrate to which stiffener 800 is attached (i.e., stiffener 800 is smaller in area than the substrate). Continuous step region 608 around the periphery of stiffener 800 may also be considered to include four separate step regions 606a-d (not indicated in FIGS. 8C and 8D), corresponding to the four edges of stiffener 800. As shown in FIG. 8C, continuous step region 608 may be continuously plated with plating material 614, or may be plated in discrete areas (not shown in FIG. 8C). Stiffener 800 of FIGS. 8C and 8D may be sized as required by a particular application. For example, stiffener 800 may be sized to have a greater or lesser area to allow for shorter or longer wire bond connections between the IC die and substrate.

Figure 9:
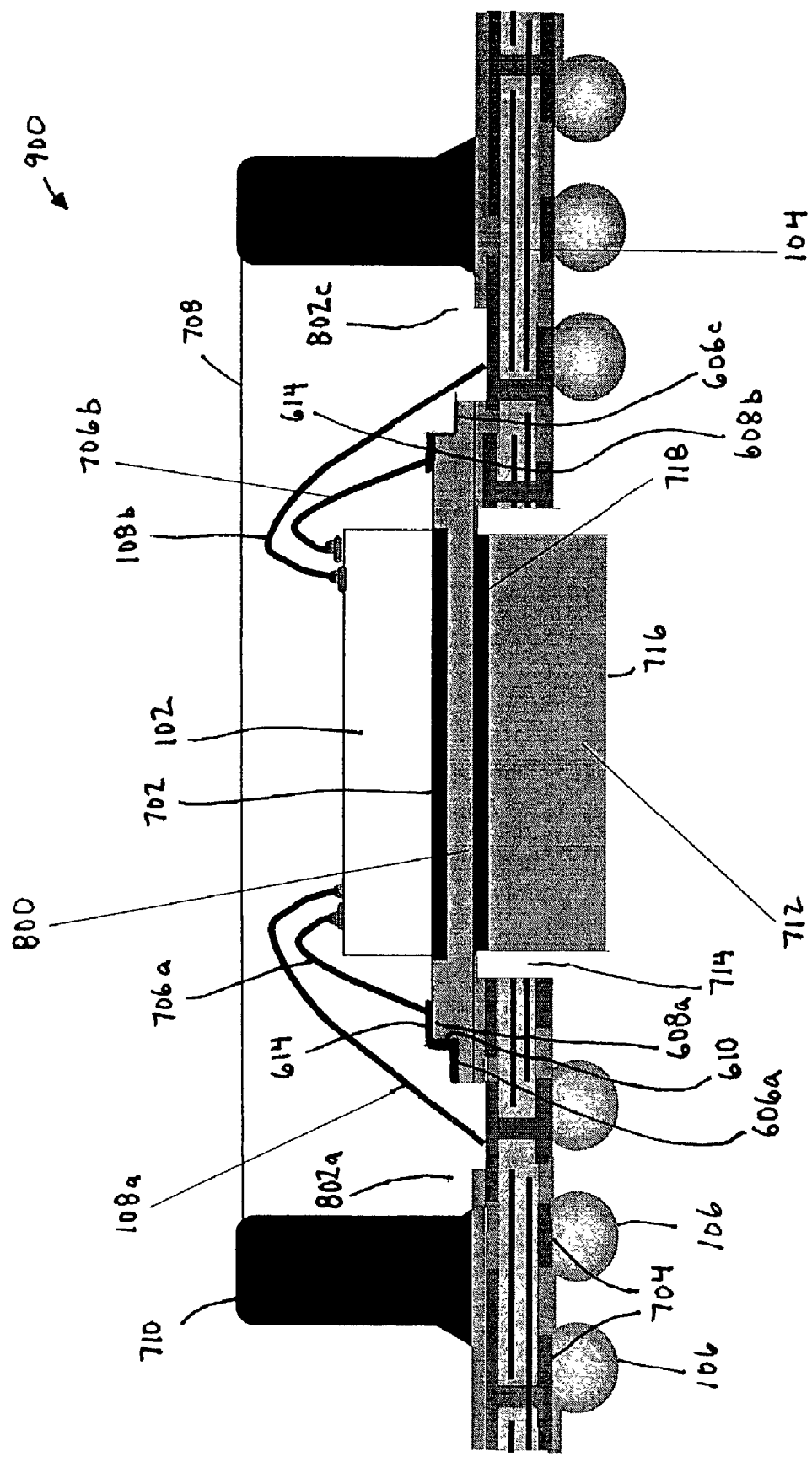
FIG. 9 shows a cross-sectional view of a BGA package with the stepped stiffener of FIGS. 8A and 8B, according to an example embodiment of the present invention.

FIG. 9 shows an example BGA package 900, according to a further embodiment of the present invention. BGA package 900 includes stiffener 800 as shown in FIGS. 8A and 8B or 8C and 8D. As shown in FIG. 9, BGA package 900 is substantially similar to BGA package 700 of FIG. 7, except for the incorporation of stiffener 800. As shown in FIG. 9, first and second wire bonds 108a and 108b are coupled to a contact pad on the top surface of substrate 104. First wire bond 108a is coupled over first recessed step area 606a and through first recessed edge portion 802a. Second wire bond 108b is coupled over third recessed step area 606c and through third recessed edge portion 802c. Any number of wire bond connections may be made through recessed edge portions 802.

Stiffener 800 of FIGS. 8A-8D and 9 provides the mechanical, electrical, and thermal benefits of the embodiments for stiffener 600 described above. Furthermore, because the outer edges of stiffener 800 do not extend to the edges of substrate 104, more space is provided for contact pads on the top surface of substrate 104. Hence, greater numbers of wire bond connections may be accommodated.

According to embodiments of the present invention, stiffeners 600 and 800 can be made from a variety of materials. For example, stiffeners 600 and 800 can be made from a metal, such as copper, a copper based alloy, aluminum, an aluminum based alloy, as well as other types of metals and alloys. Stiffeners 600 and 800 can also be made from ceramic materials, thermally conductive dielectric materials, organic materials, plastics, and combinations of these materials, as would be known to one skilled in the relevant art(s) based on the teachings described herein. In embodiments, stiffeners 600 and 800 are made from an electrically conductive material to enhance their electrical properties. Additionally or alternatively, stiffeners 600 and 800 may be made from thermally conductive materials to enhance their thermal characteristics.

The surfaces of stiffeners 600 and 800 are not required to be finished with physical and chemical treatments. However, one or more surfaces of stiffener 600 and 800 may be finished with physical and chemical treatments. For example, surfaces of stiffeners 600 and 800 may be finished using processes such as micro-etch or oxidation to promote adhesion of an encapsulating material to the respective stiffener. In embodiments, as described above, a surface plating of a plating material 614, such as silver, solder, nickel, gold, or other metals and alloys thereof, may be applied on one or more surfaces of stiffeners 600 and 800 to create spot, strip, bar, ring, and other shape contact areas for wire bond attachment to the respective stiffener.

Furthermore, stiffeners 600 and 800 may have any number of one or more recessed step areas 606. For example, stiffeners 600 and 800 may have a recessed step area 606 that corresponds to each of one, two, three, or four edges of IC die 102.

Figure 10:
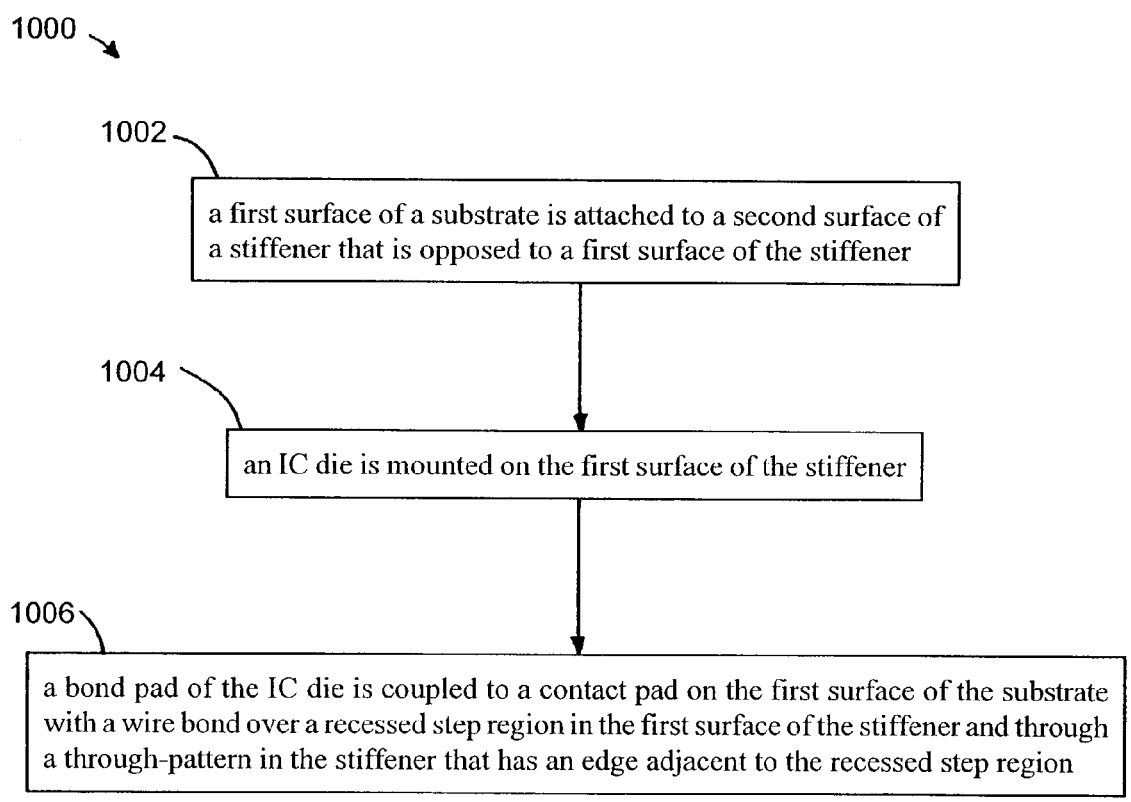
FIG. 10 shows a flowchart providing example steps for assembling a BGA package with stepped stiffener, according to embodiments of the present invention.

FIG. 10 shows a flowchart providing steps for assembling a BGA package according to one or more embodiments of the present invention. The steps of FIG. 10 do not necessarily have to occur in the order shown, as will be apparent to persons skilled in the relevant art(s) based on the teachings herein. Other operational and structural embodiments will be apparent to persons skilled in the relevant art(s) based on the following discussion. These steps are described in detail below.

Flowchart 1000 begins with step 1002. In step 1002, a first surface of a substrate is attached to a second surface of a stiffener that is opposed to a first surface of the stiffener. For example, the substrate is substrate 104, and the stiffener is one of stiffeners 600 and 800. As shown in FIGS. 7 and 9, substrate 104 is attached to bottom surface 604 of stiffeners 600 and 800. Bottom surface 604 of stiffeners 600 and 800 is opposed to top surface 602.

In step 1004, an IC die is mounted on the first surface of the stiffener. For example, the IC die is IC die 102, which is mounted in central region 612 of top surface 602 of stiffeners 600 and 800, as shown in FIGS. 7 and 9.

In step 1006, a bond pad of the IC die is coupled to a contact pad on the first surface of the substrate with a wire bond over a recessed step region in the first surface of the stiffener and through a through-pattern in the stiffener that has an edge adjacent to the recessed step region. For example, the wire bond is one of wire bonds 108a and 108b, as shown in FIGS. 7 and 9. The recessed step region may be a recessed step region 606, such as shown in FIGS. 6A, 6B, 7, 8A-8D, and 9. The through-pattern may be an opening 114 through stiffener 600 as shown in FIGS. 6A, 6B, and 7, a recessed edge portion 802 in an edge of stiffener 800 as shown in FIGS. 8A, 8B, and 9, a recessed edge of stiffener 800 as shown in FIGS. 8C and 8D, or other through-pattern described herein. As shown in FIGS. 6A, 6B, and 7, openings 114 have an edge adjacent to recessed step regions 606. As shown in FIGS. 8A, 8B, and 9, recessed edge portions 802 have an edge adjacent to recessed step regions 606. Furthermore, as shown in FIGS. 7 and 9, wire bonds 108a and 108b are coupled over recessed step regions 606, and through the through-patterns described herein.

In an embodiment, the through-pattern is an opening through the stiffener. For example, the opening may be opening 114 as shown in FIGS. 6A and 6B. In such an embodiment, step may include the step where the wire bond is coupled through the opening. For example the wire bond may be one of wire bond 108a and 108b, which are coupled through openings 114a and 114c, respectively, as shown in FIG. 7.

In an embodiment, the through-pattern is a recessed edge portion in an edge of the first and second surfaces of the stiffener. For example, the recessed edge portion may be recessed edge portion 802 as shown in FIGS. 8A and 8B. In such an embodiment, step may include the step where the wire bond is coupled through the recessed edge portion. For example, the wire bond may be one of wire bonds 108a and 108b, which are coupled through recessed edge portions 802a and 802c, respectively, as shown in FIG. 9.

As described above, in an embodiment, the recessed step region may be plated with an electrically conductive material. For example, in an embodiment, the recessed step region may be one of recessed step regions 606a, 606b, and 606d, which are plated with plating material 614. In embodiments, plating material 614 may be an electrically conductive material.

Furthermore, as described above, an area of the first surface along the through-pattern may be plated with an electrically conductive material. For example, in an embodiment, the area of the first surface along the through-pattern may be one of areas 608a and 608b, which are plated with plating material 614. In embodiments, plating material 614 may be an electrically conductive material.

Further steps for the processes of flowchart shown in FIG. 10 will be known to persons skilled in the relevant art(s) from the teachings herein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A ball grid array (BGA) package, comprising:
   a stiffener that has
      a first surface,
      a second surface opposed to said first surface,
      an opening through said stiffener that is open at said first surface and said second surface of said stiffener, and
      a recessed step region in said first surface of said stiffener along an edge of said opening;
   a substantially planar substrate that has a plurality of contact pads on a first surface of said substrate that are electrically connected through said substrate to a plurality of solder ball pads on a second surface of said substrate, wherein said second surface of said stiffener is attached to said first surface of said substrate; and
   an IC die mounted to said first surface of said stiffener.

2. The package of claim 1, wherein said edge is a closest edge of said opening to a central region of said first surface of said stiffener.

3. The stiffener of claim 1, wherein said opening is substantially rectangular or trapezoidal shaped.

4. The stiffener of claim 1, wherein said opening is irregular shaped.

5. The stiffener of claim 1, wherein said recessed step region is substantially rectangular shaped.

6. The stiffener of claim 1, wherein said recessed step region is substantially trapezoidal shaped.

7. The stiffener of claim 1, wherein said recessed step region is irregular shaped.

8. The package of claim 1, wherein said first surface and said second surface of said stiffener are substantially planar, and wherein said recessed step region has a surface that is substantially planar.

9. The package of claim 1, further comprising:
a second opening through said stiffener that is open at said first surface and said second surface of said stiffener;
a second recessed step region in said first surface of said stiffener along an edge of said second opening.

10. The package of claim 1, further comprising:
a plurality of openings through said stiffener that are open at said first surface and said second surface of said stiffener;
a plurality of recessed step regions in said first surface of said stiffener, wherein each of said plurality of recessed step regions is located along an edge of a corresponding opening of said plurality of openings.

11. The package of claim 1, wherein said recessed step region is plated with an electrically conductive material.

12. The package of claim 1, wherein an area of said first surface of said stiffener adjacent to said recessed step region is plated with an electrically conductive material.

13. The package of claim 11, wherein said electrically conductive material includes at least one metal.

14. The package of claim 13, wherein said at least one metal includes at least one of gold and silver.

15. The package of claim 1, further comprising:
a wire bond that couples a bond pad of said IC die to a contact pad of said plurality of contact pads over said recessed step region and through said opening.

16. The package of claim 1, further comprising:
a wire bond that couples a bond pad of said IC die to said recessed step region.

17. The package of claim 1, further comprising:
a wire bond that couples a bond pad of said IC die to said first surface of said stiffener.

18. A ball grid array (BGA) package, comprising:
a stiffener that has
a first surface,
a second surface opposed to said first surface,
a recessed edge portion in an edge of said first surface and said second surface, and
a recessed step region in said first surface of said stiffener along said recessed edge portion;
a substantially planar substrate that has a plurality of contact pads on a first surface of said substrate that are electrically connected through said substrate to a plurality of solder ball pads on a second surface of said substrate, wherein said second surface of said stiffener is attached to said first surface of said substrate; and
an IC die mounted to said first surface of said stiffener.

19. The stiffener of claim 18, wherein said recessed edge portion is substantially rectangular or trapezoidal shaped.

20. The stiffener of claim 18, wherein said recessed edge portion is irregular shaped.

21. The stiffener of claim 18, wherein said recessed step region is substantially rectangular shaped.

22. The stiffener of claim 18, wherein said recessed step region is substantially trapezoidal shaped.

23. The stiffener of claim 18, wherein said recessed step region is irregular shaped.

24. The package of claim 18, wherein said first surface and said second surface of said stiffener are substantially planar, and wherein said recessed step region has a surface that is substantially planar.

25. The package of claim 18, further comprising:
a second recessed edge portion in a second edge of said first surface and said second surface of said stiffener; and
a second recessed step region in said first surface of said stiffener along said second recessed edge portion.

26. The package of claim 18, further comprising:
a plurality of recessed edge portions that each correspond to an edge of said first surface and said second surface of said stiffener; and
a plurality of recessed step regions in said first surface of said stiffener, wherein each of said plurality of recessed step regions is located along a corresponding recessed edge portion of said plurality of recessed edge portions.

27. The package of claim 18, wherein said recessed step region is plated with an electrically conductive material.

28. The package of claim 18, wherein an area of said first surface of said stiffener adjacent to said recessed step region is plated with an electrically conductive material.

29. The package of claim 27, wherein said electrically conductive material includes at least one metal.

30. The package of claim 29, wherein said at least one metal includes at least one of gold and silver.

31. The package of claim 18, further comprising:
a wire bond that couples a bond pad of said IC die to a contact pad of said plurality of contact pads over said recessed step region and through said recessed edge portion.

32. The package of claim 18, further comprising:
a wire bond that couples a bond pad of said IC die to said recessed step region.

33. The package of claim 18, further comprising:
a wire bond that couples a bond pad of said IC die to said first surface of said stiffener.

34. A stiffener in a ball grid array (BGA) package, comprising:
a first surface;
a second surface opposed to said first surface;
a first opening through the stiffener that is open at said first surface and said second surface;
a first recessed step region in said first surface along an edge of said first opening;
a second opening through the stiffener that is open at said first surface and said second surface; and
a second recessed step region in said first surface along an edge of said second opening.

35. The stiffener of claim 34, wherein said edge along said first opening is a closest edge of said first opening to a central region of said first surface of said stiffener.

36. The stiffener of claim 34, wherein said first opening is substantially rectangular or trapezoidal shaped.

37. The stiffener of claim 34, wherein said first opening is irregular shaped.

38. The stiffener of claim 34, wherein said first recessed step region is substantially rectangular shaped.

39. The stiffener of claim 34, wherein said first recessed step region is substantially trapezoidal shaped.

40. The stiffener of claim 34, wherein said first recessed step region is irregular shaped.

41. The stiffener of claim 34, wherein said first surface and said second surface are substantially planar, and wherein said first recessed step region has a surface that is substantially planar.

42. The stiffener of claim 34, wherein said first recessed step region is plated with an electrically conductive material.

43. The stiffener of claim 42, wherein said electrically conductive material includes at least one metal.

44. The stiffener of claim 43, wherein said at least one metal includes at least one of gold and silver.

45. The stiffener of claim 34, wherein an area of said first surface adjacent to said first recessed step region is plated with an electrically conductive material.

46. The stiffener of claim 34, wherein said first recessed step region, an area of said first surface adjacent to said first recessed step region, and a surface area between said first recessed step region and said area of said first surface are plated with an electrically conductive material.

47. The stiffener of claim 34, wherein the stiffener is a heat spreader.

48. The stiffener of claim 34, wherein the stiffener comprises at least one metal.

49. The stiffener of claim 48, wherein said at least one metal includes copper.

50. The stiffener of claim 48, wherein said at least one metal includes aluminum.

51. The stiffener of claim 34, wherein the stiffener comprises at least one of a ceramic, a dielectric material, an organic material, and a plastic.

52. The stiffener of claim 34, wherein the stiffener is electrically conductive.

53. A stiffener in a ball grid array (BGA) package, comprising:
   a first surface, having a central portion for mounting an IC die;
   a second surface opposed to said first surface;
   a first recessed edge portion in an outer edge of said first surface and said second surface;
   a first recessed step region in said first surface along said first recessed edge portion;
   a second recessed edge portion in an outer edge of said first surface and said second surface; and
   a second recessed step region in said first surface along said second recessed edge portion.

54. The stiffener of claim 53, wherein said first recessed edge portion is substantially rectangular or trapezoidal shaped.

55. The stiffener of claim 53, wherein said first recessed edge portion is irregular shaped.

56. The stiffener of claim 53, wherein said first recessed step region is substantially rectangular shaped.

57. The stiffener of claim 53, wherein said first recessed step region is substantially trapezoidal shaped.

58. The stiffener of claim 53, wherein said first recessed step region is irregular shaped.

59. The stiffener of claim 53, wherein said first surface and said second surface are substantially planar, and wherein said first recessed step region has a surface that is substantially planar.

60. The stiffener of claim 53, wherein said first recessed step region is plated with an electrically conductive material.

61. The stiffener of claim 53, wherein an area of said first surface adjacent to said first recessed step region is plated with an electrically conductive material.

62. The stiffener of claim 61, wherein said electrically conductive material includes at least one metal.

63. The stiffener of claim 62, wherein said at least one metal includes at least one of gold and silver.

64. The stiffener of claim 53, wherein the stiffener is a heat spreader.

65. The stiffener of claim 53, wherein the stiffener comprises at least one metal.

66. The stiffener of claim 65, wherein said at least one metal includes copper.

67. The stiffener of claim 65, wherein said at least one metal includes aluminum.

68. The stiffener of claim 53, wherein the stiffener comprises at least one of a ceramic, a dielectric material, an organic material, and a plastic.

69. The stiffener of claim 53, wherein the stiffener is electrically conductive.

70. A stiffener in a ball grid array (BGA) package, comprising:
   a first surface, having a central portion for mounting an IC die;
   a second surface opposed to said first surface;
   a plurality of openings through the stiffener that are open at said first surface and said second surface; and
   a plurality of recessed step regions in said first surface, wherein each of said plurality of recessed step regions is located along an edge of a corresponding opening of said plurality of openings.

71. A stiffener in a ball grid array (BGA) package, comprising:
   a first surface, having a central portion for mounting an IC die;
   a second surface opposed to said first surface;
   a plurality of recessed edge portions that each correspond to an outer edge of said first surface and said second surface; and
   a plurality of recessed step regions in said first surface, wherein each of said plurality of recessed step regions is located along a corresponding recessed edge portion of said plurality of recessed edge portions.

* * * * *